US008232478B2

(12) United States Patent
Kim et al.

(10) Patent No.: US 8,232,478 B2
(45) Date of Patent: Jul. 31, 2012

(54) ELECTROMAGNETIC INTERFERENCE NOISE REDUCTION BOARD USING ELECTROMAGNETIC BANDGAP STRUCTURE

(75) Inventors: Han Kim, Yongin-si (KR); Je-Gwang Yoo, Yongin-si (KR); Chang-Sup Ryu, Yongin-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 314 days.

(21) Appl. No.: 12/654,766

(22) Filed: Dec. 31, 2009

(65) Prior Publication Data

US 2010/0212951 A1  Aug. 26, 2010

(30) Foreign Application Priority Data

Feb. 24, 2009 (KR) ................. 10-2009-0015332

(51) Int. Cl.
*H05K 9/00* (2006.01)
(52) U.S. Cl. ........ 174/256; 174/262; 174/267; 361/763; 361/766; 361/784; 361/816; 361/818; 333/12; 333/22 R; 333/185; 343/700 MS; 343/909
(58) Field of Classification Search .......... 174/250–267, 174/360, 367; 361/760–767, 780–785, 790–795, 361/772, 788, 816, 818; 333/12, 22 R, 167, 333/175, 185, 202, 204, 212, 246, 248; 343/700 MS, 343/729, 767, 771, 829, 846, 853, 860, 909; 257/532, 533, 621, 664, 665, 697, 724, 786
See application file for complete search history.

(56) References Cited

U.S. PATENT DOCUMENTS

| | | | | |
|---|---|---|---|---|
| 5,396,397 A * | 3/1995 | McClanahan et al. | ........ | 361/313 |
| 5,404,118 A * | 4/1995 | Okamura et al. | ............. | 333/175 |
| 5,586,011 A * | 12/1996 | Alexander | ..................... | 361/818 |
| 5,696,471 A * | 12/1997 | Fujiwara | ....................... | 333/177 |
| 5,978,231 A * | 11/1999 | Tohya et al. | ................... | 361/782 |
| 6,091,310 A * | 7/2000 | Utsumi et al. | ................... | 333/12 |
| 6,222,427 B1 * | 4/2001 | Kato et al. | ...................... | 333/185 |
| 6,353,540 B1 * | 3/2002 | Akiba et al. | ................... | 361/794 |
| 6,384,706 B1 * | 5/2002 | Iwanami | ...................... | 336/200 |
| 6,384,797 B1 * | 5/2002 | Schaffner et al. | ............. | 343/795 |
| 6,429,504 B1 * | 8/2002 | Beaussart et al. | ............. | 257/531 |
| 6,483,481 B1 * | 11/2002 | Sievenpiper et al. | ......... | 343/909 |
| 6,493,861 B1 * | 12/2002 | Li et al. | ......................... | 716/137 |

(Continued)

FOREIGN PATENT DOCUMENTS

JP  2001068801 A *  3/2001

(Continued)

OTHER PUBLICATIONS

Japanese Office Action dated Jan. 31, 2012 issued in corresponding Japanese Patent Application No. 2009-273961.

*Primary Examiner* — Michail V Datskovskiy

(57) ABSTRACT

An EMI noise reduction board using an electromagnetic bandgap structure is disclosed. In the EMI noise reduction board according to an embodiment of the present invention, an electromagnetic bandgap structure having band stop frequency properties can be inserted into an inner portion of the board so as to shield an EMI noise, in which the portion corresponds to an edge of the board and in which the EMI noise is conducted from the inside to the edge of the board and radiates to the outside of the board.

21 Claims, 37 Drawing Sheets

U.S. PATENT DOCUMENTS

| | | | |
|---|---|---|---|
| 6,512,494 B1* | 1/2003 | Diaz et al. | 343/909 |
| 6,624,536 B1* | 9/2003 | Sawada et al. | 307/91 |
| 6,774,867 B2* | 8/2004 | Diaz et al. | 343/909 |
| 6,782,243 B2* | 8/2004 | Shiotsu et al. | 455/117 |
| 6,806,793 B2* | 10/2004 | Pillai et al. | 333/175 |
| 6,847,282 B2* | 1/2005 | Gomez et al. | 336/200 |
| 6,853,350 B2* | 2/2005 | Alexopoulos et al. | 343/895 |
| 6,861,899 B2* | 3/2005 | Konishi | 327/565 |
| 6,897,831 B2* | 5/2005 | McKinzie et al. | 343/909 |
| 6,917,343 B2* | 7/2005 | Sanchez et al. | 343/795 |
| 6,933,895 B2* | 8/2005 | Mendolia et al. | 343/702 |
| 6,952,190 B2* | 10/2005 | Lynch et al. | 343/909 |
| 6,963,034 B2* | 11/2005 | Iwanami | 174/260 |
| 6,970,057 B2* | 11/2005 | Lin et al. | 333/177 |
| 7,016,490 B2* | 3/2006 | Beutler et al. | 379/412 |
| 7,071,889 B2* | 7/2006 | McKinzie et al. | 343/756 |
| 7,111,271 B2* | 9/2006 | Li et al. | 716/137 |
| 7,215,301 B2* | 5/2007 | Choi et al. | 343/909 |
| 7,423,500 B2* | 9/2008 | Ishiwata | 333/172 |
| 7,423,608 B2* | 9/2008 | Dunn et al. | 343/909 |
| 7,504,710 B2* | 3/2009 | Suzuki | 257/659 |
| 7,528,788 B2* | 5/2009 | Dunn et al. | 343/795 |
| 7,594,316 B2* | 9/2009 | Noda et al. | 29/830 |
| 7,626,476 B2* | 12/2009 | Kim et al. | 333/238 |
| 7,868,727 B2* | 1/2011 | Chen et al. | 336/200 |
| 7,884,697 B2* | 2/2011 | Wei et al. | 336/200 |
| 7,889,134 B2* | 2/2011 | McKinzie et al. | 343/700 MS |
| 8,134,425 B2* | 3/2012 | Rofougaran et al. | 333/174 |
| 2005/0104678 A1 | 5/2005 | Shahparnia et al. | |
| 2006/0145805 A1* | 7/2006 | Kim et al. | 336/200 |
| 2008/0169564 A1* | 7/2008 | Kim | 257/758 |
| 2008/0185179 A1* | 8/2008 | Kim et al. | 174/265 |
| 2008/0264685 A1* | 10/2008 | Park et al. | 174/262 |
| 2008/0266018 A1* | 10/2008 | Han et al. | 333/12 |
| 2008/0266026 A1* | 10/2008 | Han et al. | 333/185 |
| 2008/0314630 A1* | 12/2008 | Kim et al. | 174/261 |
| 2008/0314634 A1* | 12/2008 | Kim et al. | 174/264 |
| 2008/0314635 A1* | 12/2008 | Kim et al. | 174/264 |
| 2009/0002952 A1* | 1/2009 | Mesmer et al. | 361/720 |
| 2009/0315156 A1* | 12/2009 | Harper | 257/660 |

FOREIGN PATENT DOCUMENTS

| | | |
|---|---|---|
| JP | 2009-44151 | 2/2009 |
| JP | 2009-141326 | 6/2009 |
| JP | 2009-177130 | 8/2009 |
| JP | 2009-231793 | 10/2009 |
| KR | 10-2008-0061950 | 7/2008 |
| WO | 2009/082003 A1 | 7/2009 |

* cited by examiner

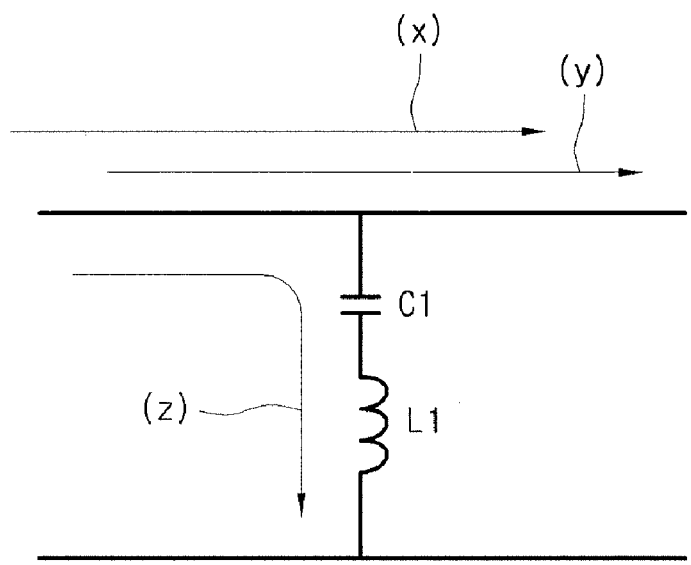

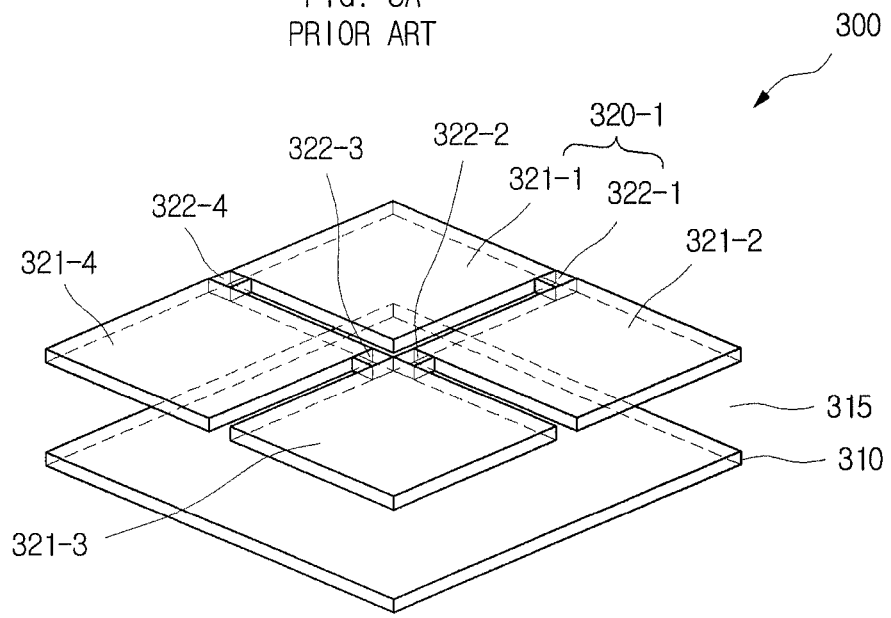

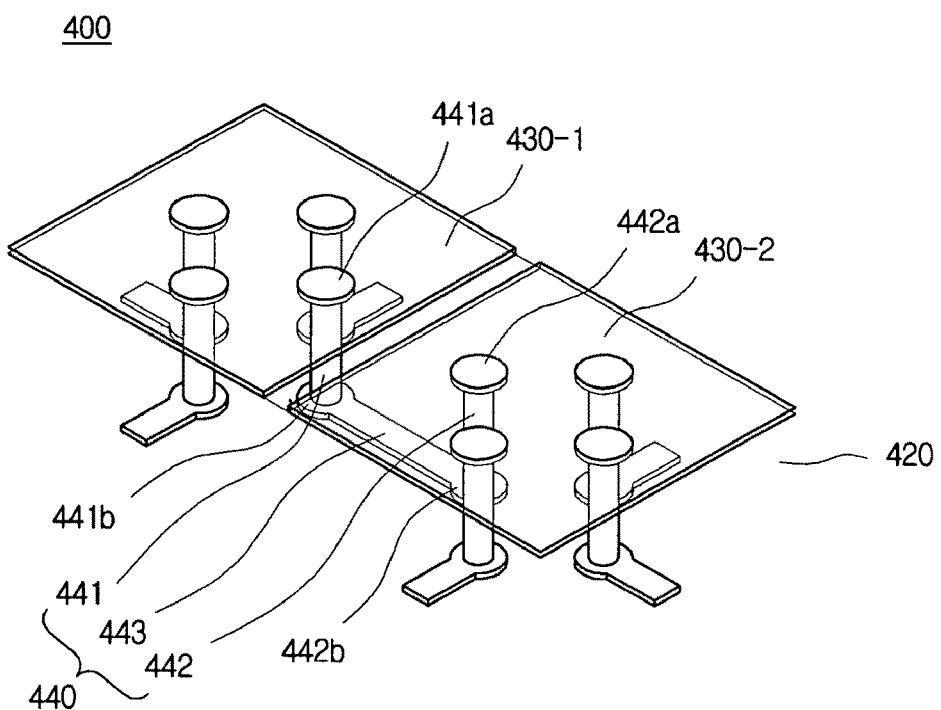

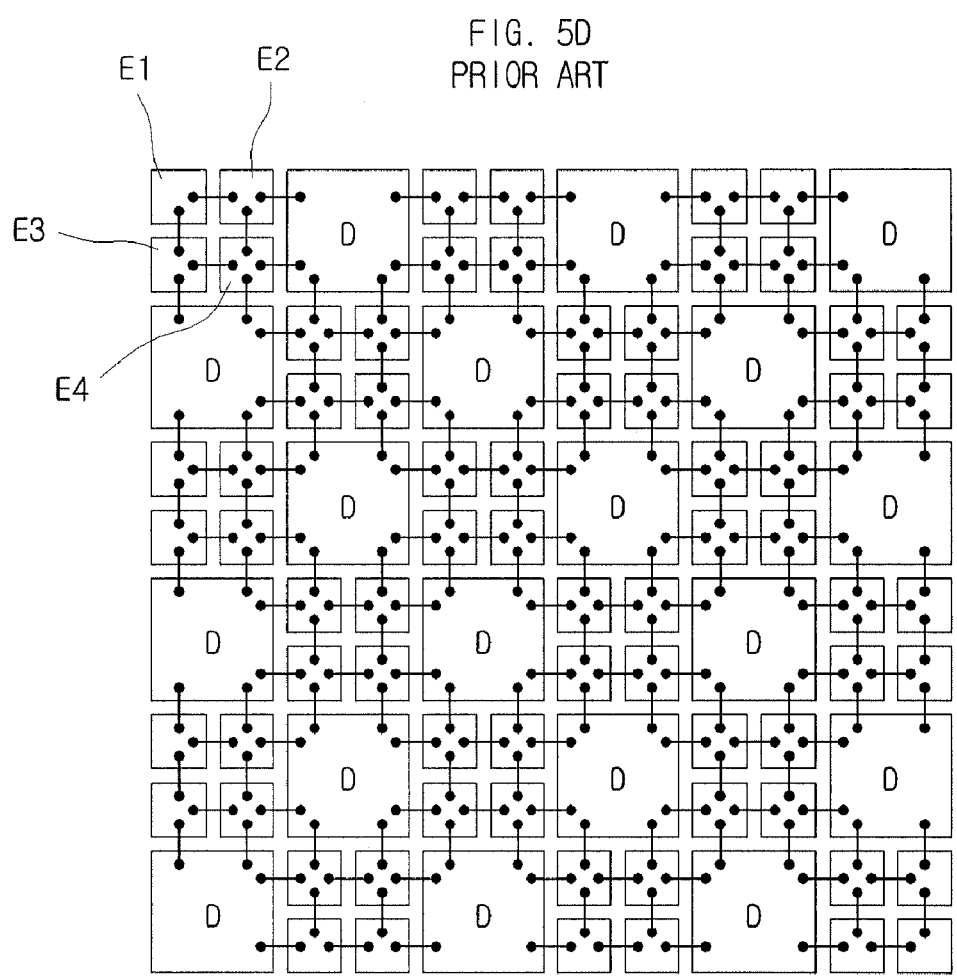

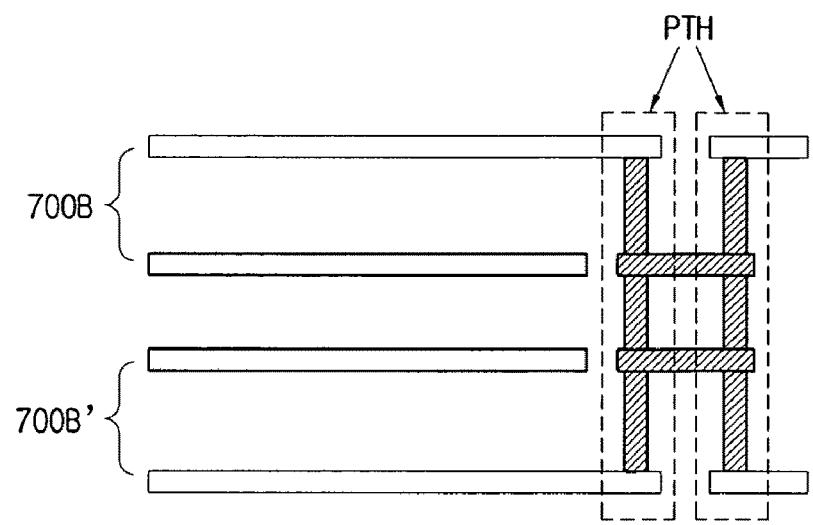

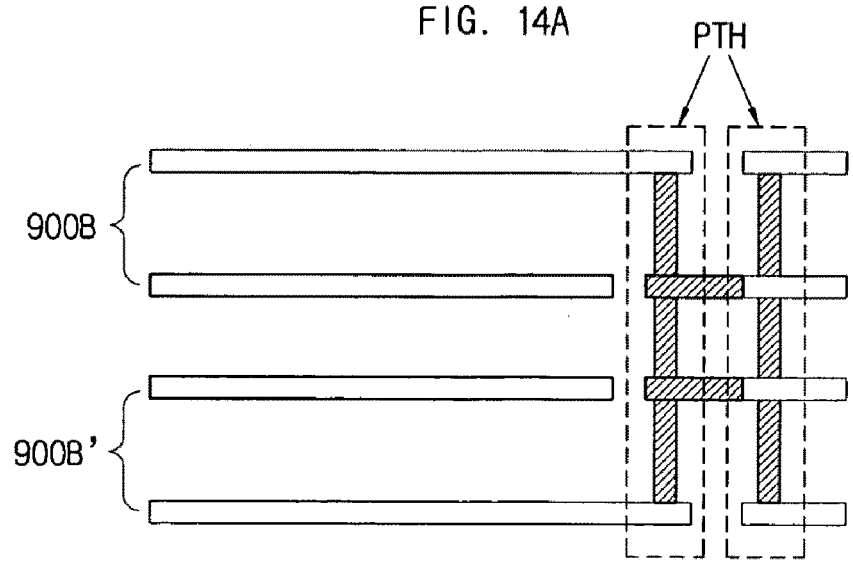

ELECTROMAGNETIC INTERFERENCE NOISE REDUCTION BOARD USING ELECTROMAGNETIC BANDGAP STRUCTURE

CROSS-REFERENCE TO RELATED APPLICATIONS

This application claims the benefit of Korean Patent Application No. 10-2009-0015332, filed with the Korean Intellectual Property Office on Feb. 24, 2009, the disclosure of which is incorporated herein by reference in its entirety.

BACKGROUND

1. Technical Field

The present invention relates to a board, more specifically to a noise reduction board that can reduce an EMI noise by use of an electromagnetic bandgap structure.

2. Description of the Related Art

As the operating frequencies of electric products become higher, electromagnetic interference (EMI) has been perceived as a chronic noise problem. Particularly, the operating frequencies of electric products have reached a few ten megahertzs (MHz), or even a few gigahertzs (GHz), making the EMI problems more serious. Subsequently, finding a solution to the problems is desperately needed. Among the EMI problems occurring at a board, a solution for the noise problems particularly occurred at the edge of the board has not been researched yet, making it difficult to completely shield the noise at the board.

EMI noise refers to a noise that generates a noise problem caused by an interference when an electromagnetic (EM) wave generated in one electrical circuit, component or part is transferred to another electrical circuit, component or part. The EMI noise can be broadly categorized into two types, namely radiation noise (reference numerals 110 and 130 in FIG. 1) and conduction noise (reference numeral 120 in FIG. 1).

The radiation noise 110, which is radiated towards an upper side of the board (that is, the mounting surface of an electronic part), may be commonly shielded by covering an upper portion of the board by use of an electromagnetic shielding cap, for example, a metal cap. However, few studies are trying to find an effective solution for the radiation noise 130 (hereinafter, referred to as an "edge noise"), which is radiated towards the outside of the board when a conduction noise 120 inside the board is conducted to the edge of the board.

If a technology is developed to reduce the edge noise at the edge of the board through a simple modification of the board structure, it is expected to significantly reduce the development time and costs, compared to the conventional method, which solves the problem through the use of a metal cap or a circuit. Additionally, such technology can have more merits in terms of space utilization and power consumption, and can easily remove a noise in a frequency band of a few gigahertzs (GHz), making it effective in solving the EMI noise problem at the edge of the board.

SUMMARY

The present invention provides an electromagnetic interference (EMI) noise reduction board that can shield the radiation noise radiated from the edge of the board by inserting an electromagnetic bandgap structure capable of shielding a noise ranging a certain frequency band into a portion of the board corresponding to the edge of the board.

The present invention also provides an EMI noise reduction board that has advantages in space utilization, production cost and power consumption, by simply modifying the structure of the board so as to easily shield the radiation noise radiated from the edge of the board.

Other problems that the present invention solves will become more apparent through the following embodiments described below.

An aspect of the present invention provides an EMI noise reduction board having an electromagnetic bandgap structure with band stop frequency properties inserted into an inner portion of the board so as to shield an EMI noise, in which the portion corresponds to an edge of the board and in which the EMI noise is conducted from the inside to the edge of the board and radiates to the outside of the board.

In the EMI noise reduction board of the present invention, the electromagnetic bandgap structure, which is inserted into an inner portion of the board corresponding to the edge of the board, according to an embodiment of the present invention can include a plurality of conductive plates, which are placed in a line along the edge of the board, and a first stitching via, which electrically connects each of the plurality of conductive plates and another conductive portion by having a part of the first stitching via pass through a planar surface that is different from the conductive plates. Here, the another conductive portion is placed adjacent to the conductive plates towards a direction of the EMI noise.

The first stitching via can include a first via having one end part connected to the another conductive portion, a second via having one end part connected to one of the plurality of conductive plates and a connection pattern having one end part connected to the other end part of the first via and having the other end part connected to the other end part of the second via. Here, the connection pattern is placed on a planar surface that is different from the conductive plates.

The electromagnetic bandgap structure can further include a second stitching via electrically connecting any two of the plurality of conductive plates, placed in a line, with each other by having a part of the second stitching via pass through a planar surface that is different from the conductive plates.

The second stitching via can include a third via having one end part connected to one of the any two conductive plates, a fourth via having one end part connected to the other one of the any two conductive plates and a connection pattern having one end part connected to the other end part of the third via and having the other end part connected to the other end part of the fourth via. Here, the connection pattern is placed on a planar surface that is different from the conductive plates.

The electromagnetic bandgap structure can have a 2-layered structure in which a planar surface where the plurality of conductive plates are located is a first layer and a planar surface where the part of the first stitching via is located is a second layer, and the 2-layered electromagnetic bandgap structure can have an expanding structure with a multiple of 2 by having the 2-layered electromagnetic bandgap structure repeatedly stacked and inserted into an inner portion of the board corresponding to the edge of the board.

A 4-layered electromagnetic bandgap structure can be formed by having a 2-layered electromagnetic bandgap structure and another 2-layered electromagnetic bandgap structure repeatedly stacked on top of each other so as to have a same order of layer arrangement.

A 4-layered electromagnetic bandgap structure can be formed by having a 2-layered electromagnetic bandgap structure and another 2-layered electromagnetic bandgap structure repeatedly stacked on top of each other so as to have an inverse order of layer arrangement.

If the 2-layered electromagnetic bandgap structure is expanded to a 4- or more-layered structure by having two or more 2-layered electromagnetic bandgap structures repeatedly stacked on top of each other, a plated through hole (PTH) can be formed where each of the vias constituting the first stitching via is placed in the 2-layered electromagnetic bandgap structure. Here, the PTH collectively penetrates through the 4- or more-layered structure.

The electromagnetic bandgap structure can be inserted into all inner layers of the board corresponding to the location of the edge of the board.

The electromagnetic bandgap structure can be inserted into the board in the shape of a closed loop such that the electromagnetic bandgap structure completely surrounds the edge of the board.

In the EMI noise reduction board of the present invention, the electromagnetic bandgap structure, which is inserted into an inner portion of the board corresponding to the edge of the board, according to another embodiment of the present invention can include a plurality of first conductive plates, which are placed in a line along the edge of the board, a plurality of second conductive plates, in which each of the second conductive plates is overlapped with each of the plurality of first conductive plates on a planar surface that is different from the first conductive plates, a first via, which electrically connects each of the plurality of first conductive plates and each of the plurality of second conductive plates with each other, a second via, which electrically connects one end part thereof to another conductive portion that is placed adjacent to the plurality of first conductive plates towards a direction of the EMI noise, and a connection pattern, which connects one end part thereof to the other end part of the second via and which connects the other end part thereof connected to each of the plurality of second conductive plates so as to electrically connect the another conductive portion and each of the plurality of second conductive plates with each other.

The electromagnetic bandgap structure can further include a conductive line electrically connecting any two adjacent second conductive plates with each other.

The electromagnetic bandgap structure can electrically connect each of the plurality of first conductive plates and each of the plurality of second conductive plates, and can further include a third via, which is formed adjacent to the conductive line. Here, the plurality of first conductive plates and the plurality of second conductive plates overlap each other.

A dielectric layer can be interposed between the plurality of first conductive plates and the plurality of second conductive plates.

The electromagnetic bandgap structure can have a 2-layered structure in which a planar surface where the plurality of first conductive plates are located is a first layer and a planar surface where the plurality of second conductive plates and the connection pattern are located is a second layer, and the 2-layered electromagnetic bandgap structure can have an expanding structure with a multiple of 2 by having the 2-layered electromagnetic bandgap structure repeatedly stacked and inserted into an inner portion of the board corresponding to the edge of the board.

A 4-layered electromagnetic bandgap structure can be formed by having a 2-layered electromagnetic bandgap structure and another 2-layered electromagnetic bandgap structure repeatedly stacked on top of each other so as to have a same order of layer arrangement.

A 4-layered electromagnetic bandgap structure can be formed by having a 2-layered electromagnetic bandgap structure and another 2-layered electromagnetic bandgap structure repeatedly stacked on top of each other so as to have an inverse order of layer arrangement.

If the 2-layered electromagnetic bandgap structure is expanded to a 4- or more-layered structure by having two or more 2-layered electromagnetic bandgap structures repeatedly stacked on top of each other, a plated through hole (PTH) can be formed where each of the vias constituting the first stitching via is placed in the 2-layered electromagnetic bandgap structure, in which the PTH collectively penetrates through the 4- or more-layered structure.

The electromagnetic bandgap structure can be inserted into all inner layers of the board corresponding to the location of the edge of the board.

The electromagnetic bandgap structure can be inserted into the board in the shape of a closed loop such that the electromagnetic bandgap structure completely surrounds the edge of the board.

Additional aspects and advantages of the present invention will be set forth in part in the description which follows, and in part will be obvious from the description, or may be learned by practice of the invention.

BRIEF DESCRIPTION OF THE DRAWINGS

FIG. 2B is a schematic view showing an equivalent circuit of the MT-EBG structure shown in FIG. 2A.

FIG. 3A is a drawing for describing a PT-EBG structure, which is an electromagnetic bandgap structure.

FIG. 4C shows a modification of the VS-EBG structure shown in FIG. 4A.

FIGS. 5C and 5D are plan views showing a configuration of a VS-EBG structure having different sized metal plates.

FIGS. 12A to 12C are examples of partial modifications of the 4-layered electromagnetic bandgap structures shown in FIGS. 11A to 11C.

FIGS. 14A to 14C are examples of partial modifications of the 4-layered electromagnetic bandgap structure shown in FIGS. 13A to 13C.

DETAILED DESCRIPTION

Figure 1:
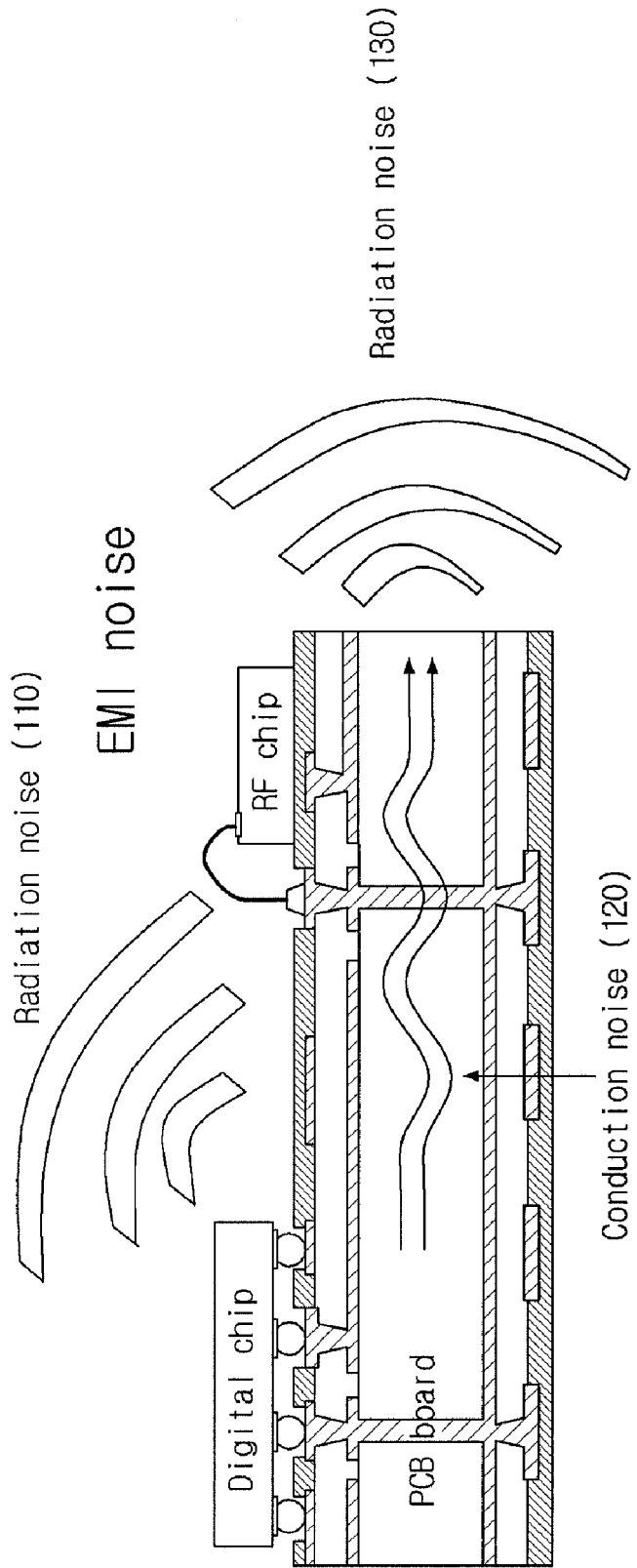
FIG. 1 is a drawing for describing an electromagnetic interference (EMI) noise problem.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

In the description of the present invention, certain detailed descriptions of related art are omitted when it is deemed that they may unnecessarily obscure the essence of the invention.

While such terms as "first" and "second," etc., may be used to describe various components, such components must not be limited to the above terms. The above terms are used only to distinguish one component from another. For example, a first component may be referred to as a second component without departing from the scope of rights of the present invention, and likewise a second component may be referred to as a first component.

Although a metal layer, a metal plate and a metal trace are used throughout the description of an electromagnetic bandgap structure, to which an EMI noise reduction board is applied, of the present invention, it shall be evidently understood that any other conductive layer, plate and trace can be substituted for the metal layer, the metal plate and the metal trace.

Prior to describing an EMI noise reduction board according to certain embodiments of the present invention, an electromagnetic bandgap structure shown in FIGS. 2A to 4C will be described below for easy understanding of the present invention.

The electromagnetic bandgap structure (EBG) capable of shielding a signal of a certain frequency band may be broadly categorized into three types, namely a Mushroom type EBG (MT-EBG), a Planar type EBG (PT-EBG) and a Via-stitched type EBG (VS-EBG). The VS-EBG structure, particularly, is a proprietary model, developed by the applicant in relation to the present invention, of SAMSUNG ELECTRO-MECHANICS Co., Ltd.

Figure 2A:
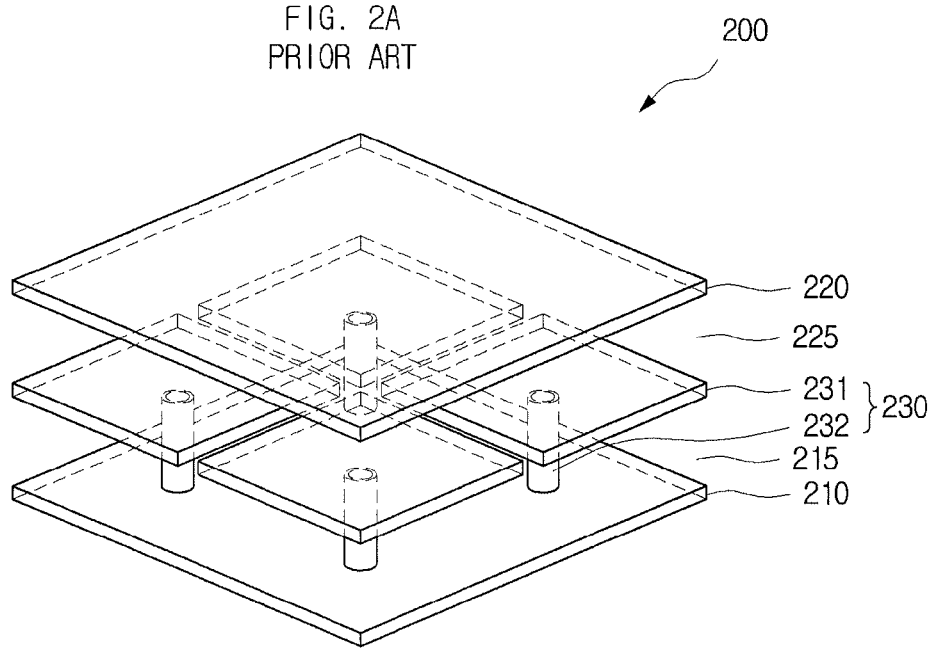
FIG. 2A is a drawing for describing an MT-EBG structure, which is an electromagnetic bandgap structure.

Firstly, a general form of the MT-EBG structure is illustrated in FIG. 2A.

The MT-EBG structure has a structure that, for example, a plurality of EBG cells (refer to reference numeral 230 of FIG. 2A) having a mushroom form are inserted in between two metal layers that are to function as a power layer and a ground layer. FIG. 2A shows only four EBG cells for the convenience of illustration.

With reference to FIG. 2A, the MT-EBG structure 200 further forms a metal plate 231 between a first metal layer 210 and a second metal layer 220, one of which functions as a ground layer and the other of which functions as a power layer, and has a form in which the mushroom type structures 230 connecting the first metal layer 210 and the metal plate 231 through a via 232 are repeatedly arranged. At this time, a first dielectric layer 215 is interposed between the first metal layer 210 and the metal plate 231, and a second dielectric layer 225 is interposed between the metal plate 231 and the second metal layer 220.

Such MT-EBG structure 200 performs the function as a band stop filter by having the state of which a capacitance component formed by the second metal layer 220, the second dielectric layer 225 and the metal plate 231, and an inductance component formed by the via 232 penetrating the first dielectric layer 215 and connecting the first metal layer 210 and the metal plate 231, are serially connected in L-C between the first metal layer 210 and the second metal layer 220. This can be easily understood through the equivalent circuit of FIG. 2B.

With reference to FIG. 2B, the MT-EBG structure 200 is implemented in such a way that a signal x of a low frequency band and a signal y of a high frequency band can pass, and a signal z of a certain frequency band ranging between the low frequency band and the high frequency band is shielded by positioning the mushroom type structures 230 between the first metal layer 210 and the second metal layer 220.

However, a shortcoming of this structure is that the number of layers is increased because at least 3 layers are required to implement the MT-EBG structure 200. In this case, not only the manufacturing cost of the PCB increases, but also the design freedom is limited.

Next, a general form of the PT-EBG structure is illustrated in FIG. 3A.

The PT-EBG structure has a structure that, for example, a plurality of EBG cells (refer to reference numeral 320-a of FIG. 3A) having a certain pattern are repeatedly arranged through any entire metal layer, which functions as a ground layer or a power layer. FIG. 3A also shows only four EBG cells for the convenience of illustration.

With reference to FIG. 3A, the PT-EBG structure 300 has a form in which any metal layer 310 and a plurality of metal plates 321-1, 321-2, 321-3 and 321-4, which are placed on another planar surface, are bridged to each other through a certain part of metal plates (the edge end of each metal plate in FIG. 3A) by metal branches 322-1, 322-2, 322-3 and 322-4.

At this time, the metal plates 321-1, 321-2, 321-3 and 321-4 having a large size constitute the low impedance area, and the metal branches having a small size constitute the high impedance area. Accordingly, the PT-EBG structure performs the function as a band stop filter that can shield a noise ranging a certain frequency band through the structure in which the low impedance area and the high impedance area are alternately repeated. This can be easily understood through the equivalent circuit of FIG. 3B.

Figure 3B:
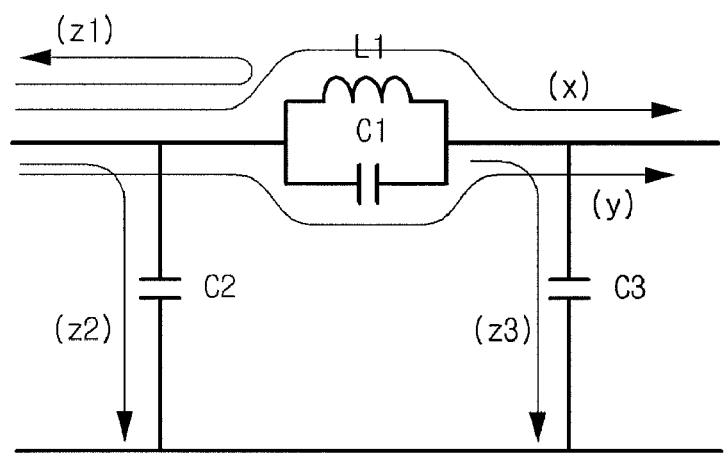
FIG. 3B is a schematic view showing an equivalent circuit of the PT-EBG structure shown in FIG. 3A.

With reference to FIG. 3B, the PT-EBG structure 300 is implemented in such a way that a signal x of a low frequency band and a signal y of a high frequency band can pass, and signals z1, z2 and z3 of a certain frequency band ranging between the low frequency band and the high frequency band can be shielded by alternately repeating the metal plates 321-1, 321-2, 321-3 and 321-4 constituting the low impedance area and the metal branches 322-1, 322-2, 322-3 and 322-4 constituting the high impedance area on the same planar surface.

Although such PT-EBG structure has a merit that is sufficient to constitute the bandgap structure by using only two layers in contrast to the structure of MT-EBG there is not only a difficulty in making cells smaller but also a design limit, which makes it hard to apply to various application products because it is formed in a larger area. This is because the PT-EBG structure forms the EBG structure by not utilizing various parameters but using only two impedance components.

Meanwhile, the VS-EBG structure, which is solely developed by the applicant, is implemented in such a way that the structural disadvantage and the design limit, which have been described above, of the MT-EBG structure and the PT-EBG structure can be solved. Such VS-EBG structure is closely related to the EBG structure, which will be described later in FIG. 6A and the drawings following thereafter, and thus the VS-EBG structure will be described in more detail in the description.

Figure 4A:
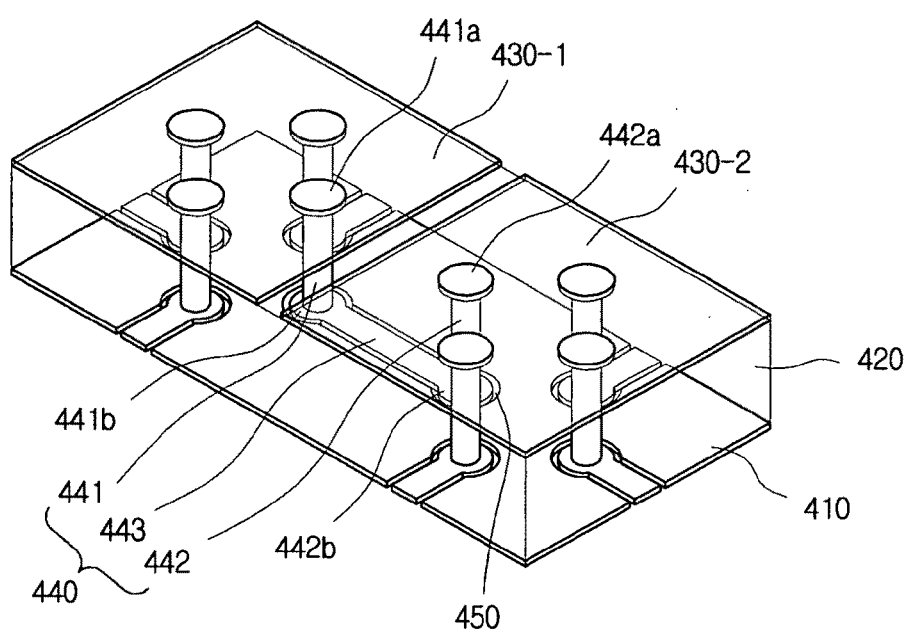
FIG. 4A shows an example of a VS-EBG structure, which is an electromagnetic bandgap structure.
Figure 4B:
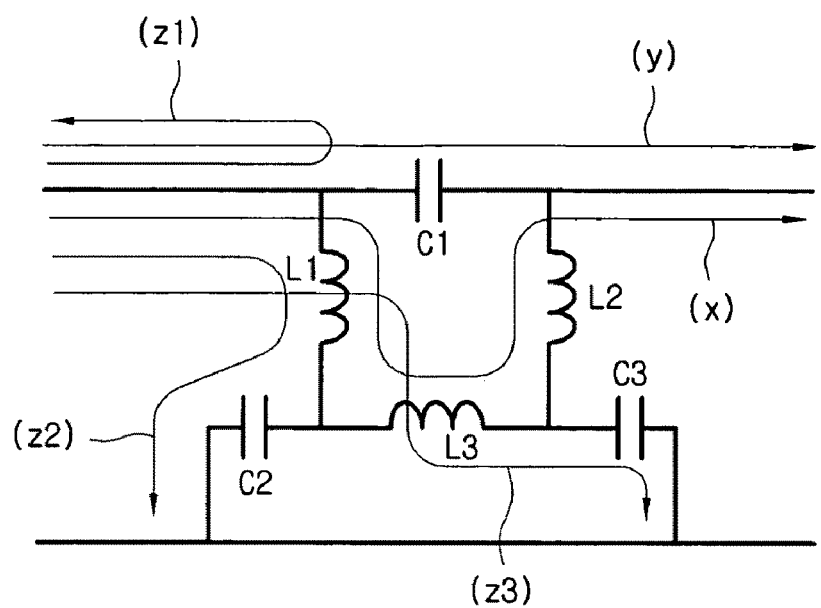
FIG. 4B is a schematic view showing an equivalent circuit of the VS-EBG structure shown in FIG. 4A.

FIG. 4A shows an example of the VS-EBG structure, which is an electromagnetic bandgap structure, and FIG. 4B is a schematic view showing an equivalent circuit of the VS-EBG structure shown in FIG. 4A. FIG. 4C shows a modification of the VS-EBG structure shown in FIG. 4A. FIGS. 5A to 5E show a various configuration of EBG cells of the VS-EBG structure.

With reference to FIG. 4A, a VS-EBG structure 400 can include a metal layer 410, a plurality of metal plates 430-1 and 430-2 (hereinafter, referred to as a first metal plate 430-1 and a second metal plate 430-2), which are separated from the metal layer 410, and a stitching via 440. FIG. 4A shows only two metal plates for the convenience of illustration.

The electromagnetic bandgap structure 400 of FIG. 4A can have 2-layered planar structure including a first layer, which consists of the metal layer 410 (or an area where a connection pattern 443 of the stitching via 440 is placed), and a second layer, which consists of the plurality of metal plates 430-1 and 430-2. A dielectric layer 420 can be interposed between the metal layer 410 and the plurality of metal plates 430-1 and 430-2.

Here, the metal layer 410 and the plurality of metal plates 430-1 and 430-2 shown in FIG. 4A may be any two layers of a multi-layered printed circuit board. In case of FIG. 4A, it shall be assumed that the metal layer 410 is on the same planar surface to correspond to an area where the connection pattern 443 of the stitching via 440 will be formed. In cases where a metal layer does not exist on the area where the connection pattern 443 will be formed, the VS-EBG structure can have a form that is similar to the form of FIG. 4C.

The metal layer 410 can be placed on a planar surface different from the planar surface, in which the plurality of metal plates 430-1 and 430-2 are placed and electrically separated from the plurality of metal plates. In other words, the metal layer 410 can form a layer that is different form the metal plates 430-1 and 430-2 with regard to electrical signals in the board. For example, if the metal layer 410 is the power layer, the metal plates 430-1 and 430-2 can be electrically connected to the ground layer. If the metal layer 410 is the ground layer, the metal plates 430-1 and 430-2 can be electrically connected to the power layer. Alternatively, if the metal layer 410 is the signal layer, the metal plates 430-1 and 430-2 can be electrically connected to the ground layer. If the metal layer 410 is the ground layer, the metal plates 430-1 and 430-2 can be electrically connected to the signal layer.

In the VS-EBG structure, a stitching via can electrically connect any two metal plates of a plurality of metal plates to each other. All accompanying drawings of this specification show that the stitching via electrically connects two adjacent metal plates to each other. However, it may be unnecessary that any two metal plates connected by the stitching via are adjacent to each other. Also, even though it is shown that one metal plate is connected to another metal plate by one stitching via, it is evidently unnecessary that the electromagnetic bandgap structure has any limitation to the number of the stitching vias connecting any two metal plates.

This specification shows the form (similar to the form of FIGS. 4A and 5A) that a metal plate and its adjacent metal plates can be electrically connected to each other through one stitching via each, and as a result, every metal plate can be electrically connected to each other. However, as long as metal plates can be formed as a closed loop by being electrically connected to each other, it can be possible to use any method of connecting the metal plates to each other through the stitching via.

With reference to FIG. 4A, the stitching via 440 can be formed including a first via 441, a second via 442 and a connection pattern 443 in order to electrically connect two adjacent metal plates.

Herein, the first via 441 can be formed to start from one end part 441a connected to the first metal plate 430-1 and penetrate the dielectric layer 420, and the second via 442 can be formed to start from one end part 442a connected to the second metal plate 430-2 and penetrate the dielectric layer 420. The connection pattern 443 can be placed on the same planar surface as the metal layer 410 and have one end part, connected to the other end part 441b of the first via 441, and the other end part, connected to the other end part 442b of the second via 442. At this time, it is evident that a via land having a larger size than the via can be formed at one end part and the other end part of each via in order to reduce the position error of a drilling process for forming the via. Accordingly, the pertinent detailed description will be omitted.

At this time, a clearance hole 450 can be formed at the edge of the connection pattern 443 of the stitching via 440 in order to prevent the metal plates 430-1 and 430-2 from being electrically connected to the metal layer 410.

That is, the two adjacent metals 430-1 and 430-2 may not be connected on the same planar surface in the VS-EBG structure. Instead, the two adjacent metals 430-1 and 430-2 can be connected to each other through another planar surface (i.e., the same planar surface as the metal layer 410) by the stitching via 440. Accordingly, the VS-EBG structure can more easily acquire an inductance component with a longer length than that of connecting the adjacent metal plates to each other on the same planar surface under the same conditions. In addition, since the adjacent metal plates of the present invention are connected to each other by the stitching via 440, it is unnecessary to form an additional pattern between the metal plates for electrically connecting the metal plates. This can make a spaced distance between the metal plates narrower. Accordingly, it can be possible to increase the capacitance component formed between the adjacent metal plates.

Described below is the principle by which the VS-EBG structure described above can function to shield a signal of a certain frequency band.

In the VS-EBG structure, the dielectric layer 420 can be interposed between the metal layer 410 and the metal plates 430-1 and 430-2. This may cause a capacitance component to be formed between the metal layer 410 and the metal plates 430-1 and 430-2 and between the two adjacent metal plates. Also, there may be an inductance component connecting through the first via 441→the connection pattern 443→the second via 442 between the two adjacent metal plates by the stitching via 440.

At this time, the value of the capacitance component can vary according to various factors such as the spaced distances between the metal layer 410 and the metal plates 430-1 and 430-2 and between the two adjacent metal plates, the dielectric constant of a dielectric material forming the dielectric layer 420 and the size, shape and area of the metal plate. Also, the value of the inductance component can vary according to various factors such as the shape, length, depth, width and area of the first via 441, a second via 442 and the connection pattern 443. Accordingly, adjusting and designing various aforementioned factors adequately can make it possible to allow the structure of FIG. 4A to function as the electromagnetic bandgap structure (i.e. a band stop filter) for removing or shielding a certain noise or a certain signal of an object frequency band. This can be easily understood through the equivalent circuit of FIG. 4B.

In the equivalent circuit of FIG. 4B, an inductance component L1 can correspond to the first via 441, an inductance component L2 can correspond to the second via 442, and an inductance component L3 can correspond to the connection pattern 443. C1 can be a capacitance component by the metal plates 430-1 and 430-2 and another dielectric layer and another metal layer to be placed above the metal plates 430-1 and 430-2. C2 and C3 can be capacitance components by the metal layer 410 placed on the same planar surface as the connection pattern 443 and another dielectric layer and another metal layer to be placed below the planar surface of the connection pattern 443.

The VS-EBG structure shown in FIG. 4B can function as a band stop filter, which shields a signal of a certain frequency band according to the above equivalent circuit of FIG. 4B. In other words, as seen in the equivalent circuit of FIG. 4B, a signal x of a low frequency band (refer to FIG. 4B) and a signal y of a high frequency band (refer to FIG. 4B) can pass through the VS-EBG structure, and signals z1, z2 and z3 of a certain frequency band (refer to FIG. 4B) ranging between the low frequency band and the high frequency band are shielded by the VS-EBG structure.

Accordingly, if such VS-EBG structure is repeatedly arranged on the whole portion (refer to FIGS. 5A, 5B, 5C and 5D) or a portion (refer to FIG. 5E) of an inner layer of the board, a signal of a certain frequency band can be prevented from being transferred.

Although each of metal plates having a square shape of the same size is illustrated for the convenience of illustration, various other modifications can be possible. Also, the VS-EBG structure can be arranged in various forms. This will be described with reference to FIGS. 5A to 5E.

Figure 5A:
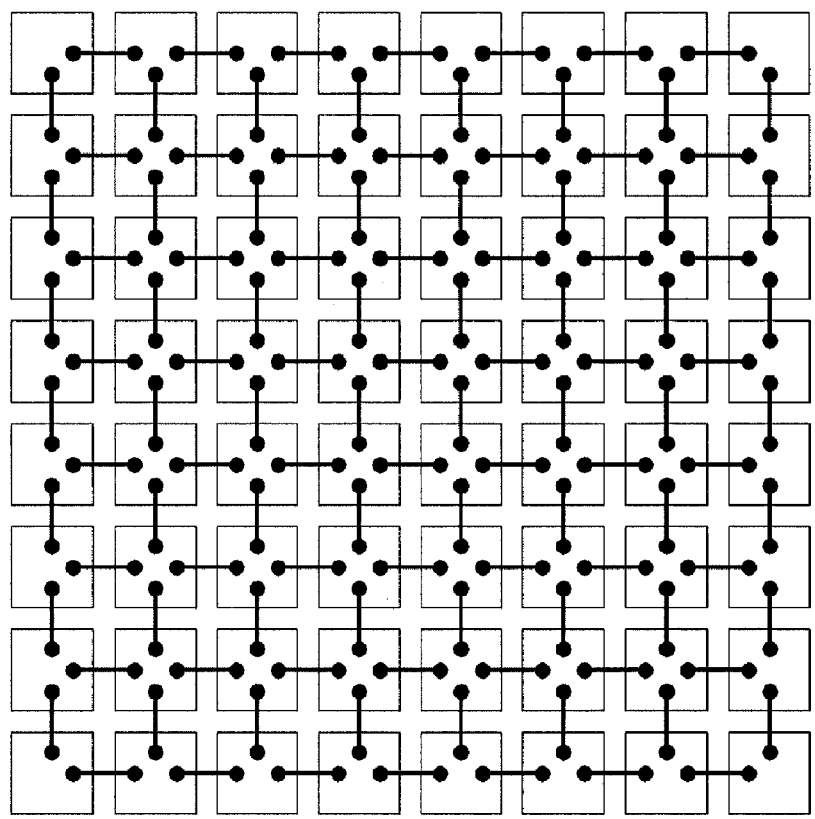
FIGS. 5A and 5B are plan views showing a configuration of a VS-EBG structure having a rectangular metal plate and a triangular metal plate, respectively.
Figure 5B:
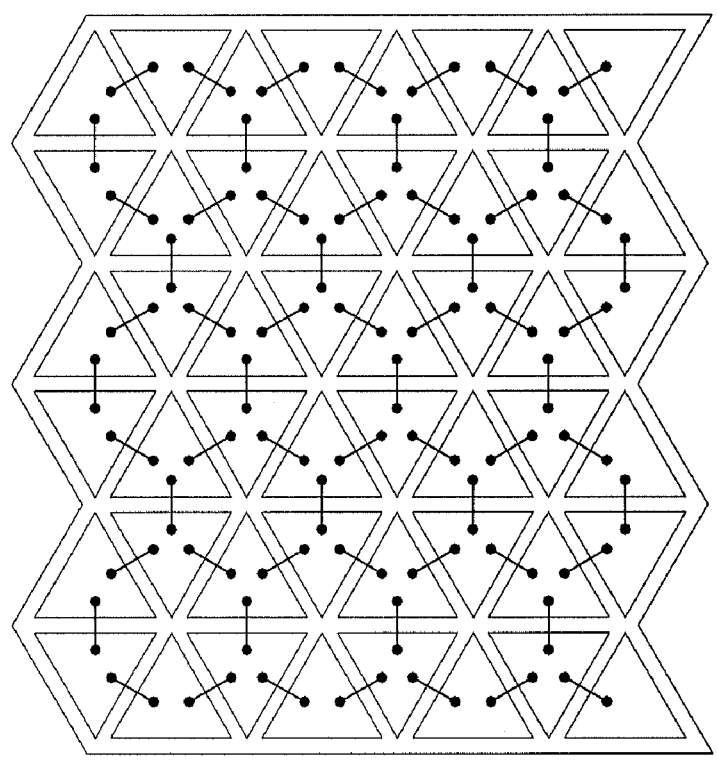

In one example, the metal plates can have various polygonal shapes including not only a rectangle as shown in FIG. 5A, and a triangle as shown in FIG. 5B, but also a hexagon, and an octagon, etc. It shall be apparent that the metal plate may not be limited to a certain shape such as a circle or an ellipse. Each of the metal plates can also have the same size (e.g. area and thickness) as shown in FIGS. 5A, 5B and 5E. If the metal plates have different sizes, the metal plates can be distinguished and placed according to each of a plurality of groups having different sizes as shown in FIG. 5C or 5D.

Figure 5C:
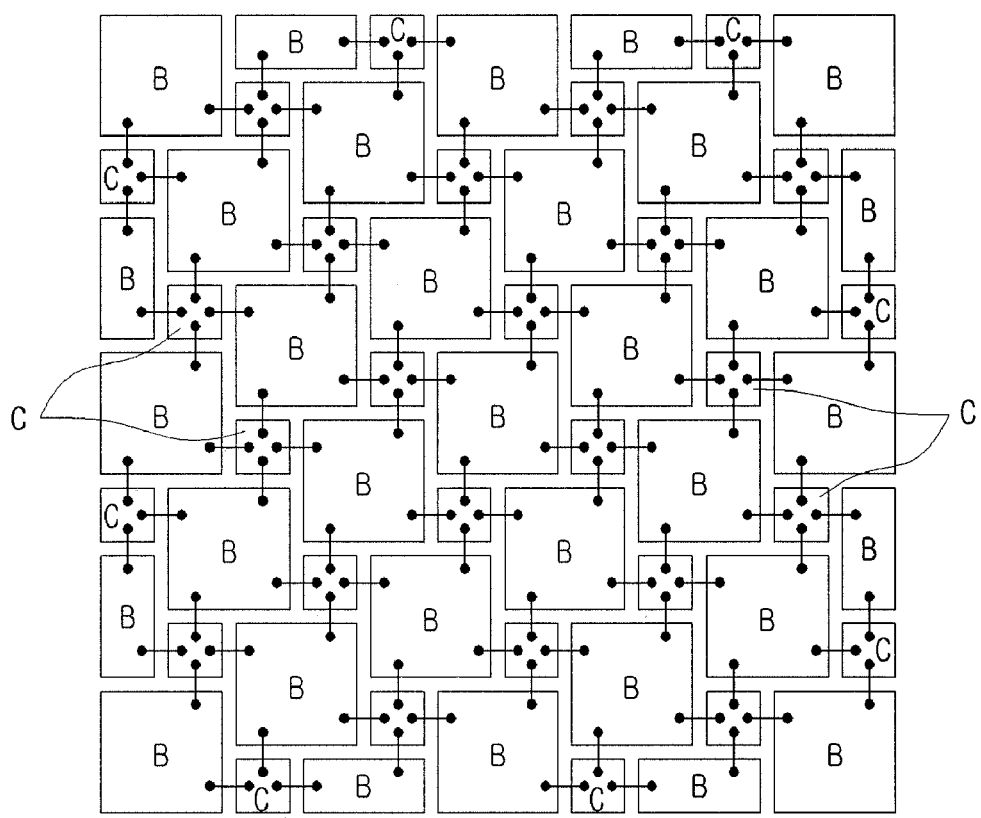
Figure 5E:
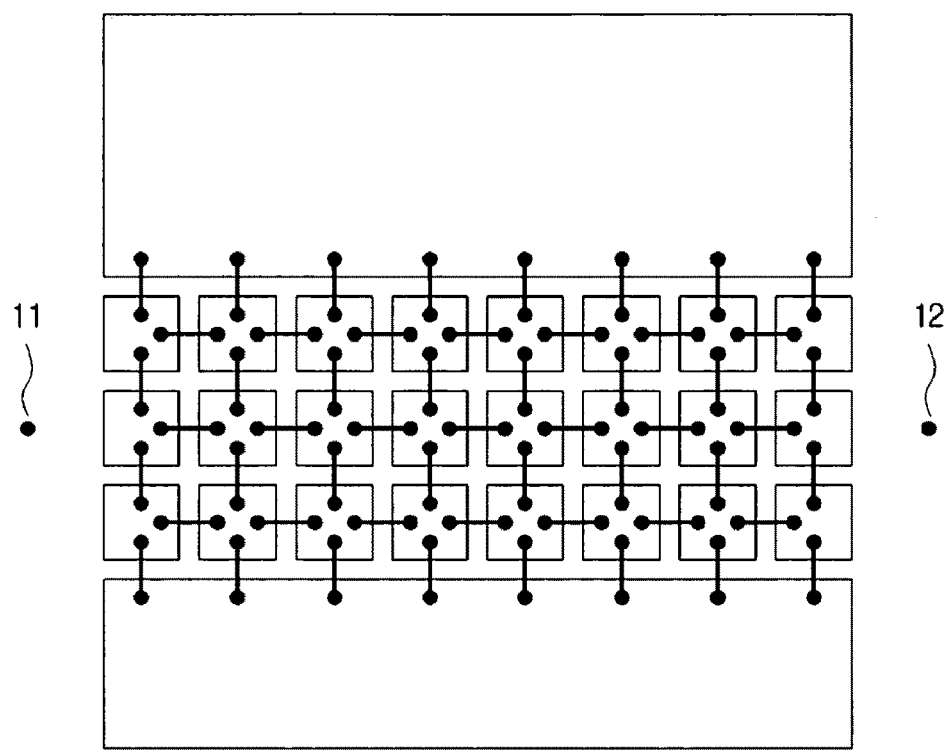
FIG. 5E is a plan view showing a band-shaped configuration of a VS-EBG structure.

In case of FIG. 5C, metal plates B having a relatively bigger size and metal plates C having a relatively smaller size can be alternately arranged. In case of FIG. 5D, metal plates D having a relatively bigger size and metal plates E1, E2, E3 and E4 having a relatively smaller size can be arranged. The smaller metal plates E1, E2, E3 and E4 can be grouped in a 2×2 form, and can occupy the area similar to the larger metal plate D.

In addition, while the cells of the electromagnetic bandgap structures can be densely arranged on the whole portion of an inner surface of the printed circuit board as shown in FIGS. 5A to 5D, the cells can be naturally arranged on some paths as shown in FIG. 5E. For example, as shown in FIG. 5E, if it is assumed that a point 11 refers to a noise source point and a point 12 refers to a noise shielding destination point, the cells can be repeatedly arranged in at least one line along a noise transferable path between the noise source point 11 and the noise shielding destination point 12 so as to shield a conductive noise, which is conducted along the path. Likewise, as shown in FIG. 5E, if it is assumed that a point 21 refers to the noise source point and a point 22 refers to the noise shielding destination point, the same can be applied.

The object of an EMI noise reduction board according to an embodiment of the present invention is not to shield a conductive noise inside the board, but to prevent the conductive noise, which is conducted to the edge of the board, from being radiated to the outside of the board (i.e., to shield the "edge noise").

Therefore, the electromagnetic bandgap structure, which is applied to the EMI noise reduction board of the present invention, can have a structure with properties similar to the VS-EBG structure, and can have a different arranging and inserting structure than those of FIGS. 5A to 5E. Hereinafter, no redundant description of the aforementioned VS-EBG structure will be repeated, or the description of the content in which the same structural properties are described will be omitted. Below descriptions focus on the properties of the EMI noise reduction board according to some embodiments of the present invention.

In the EMI noise reduction board according to an embodiment of the present invention, an electromagnetic bandgap structure having band stop frequency properties can be inserted into a portion of the board corresponding to the edge of the board (i.e., the area where the edge noise will be radiated to outside) in order to shield an EMI noise, i.e., the edge noise (refer to the reference numeral 130), which is conducted from inside to the edge of the board and radiates to the outside of the board.

Although it may vary considerably in accordance with the space allowance of a space, in which the electromagnetic bandgap structure is inserted, and the design freedom or in accordance with the design limiting factors (for example, the required minimum size of metal plates) of EBG cells that are designed to correspond to the frequency band of the edge noise to be shield, it may be generally difficult to insert many lines of EBG cells into the edge of the board.

Figure 6A:
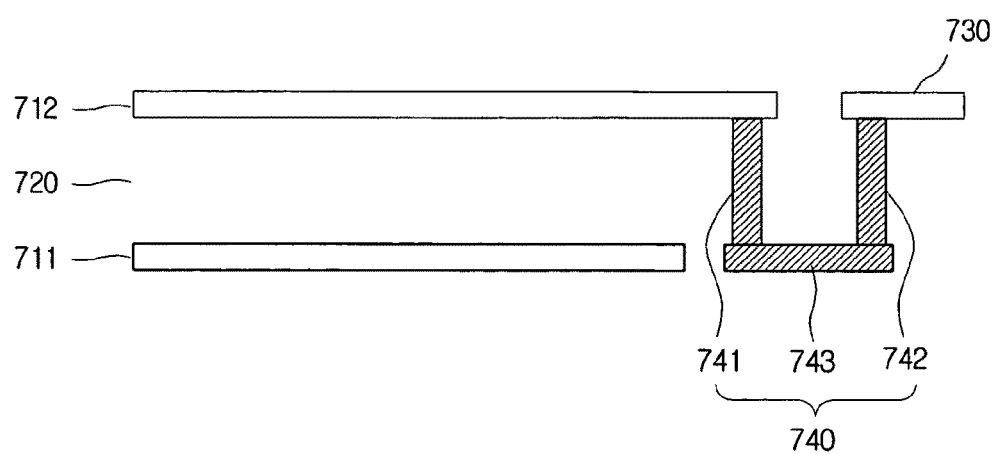
FIG. 6A is a vertical sectional view showing an example of a 2-layered electromagnetic bandgap structure being inserted into an EMI noise reduction board according to an embodiment of the present invention.
Figure 6B:
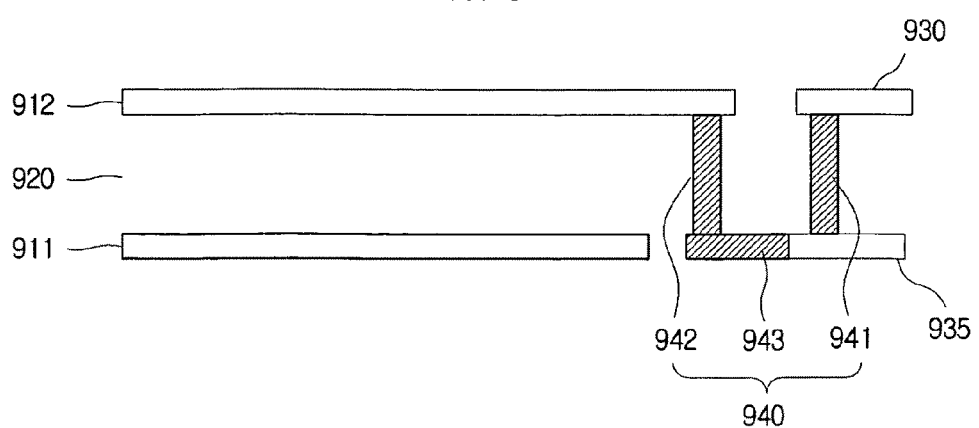
FIG. 6B is a vertical sectional view showing another example of a 2-layered electromagnetic bandgap structure being inserted into an EMI noise reduction board according to an embodiment of the present invention.

For this reason, it is preferable in the EMI noise reduction board of the present invention that an EBG structure, which is inserted into a portion of the board corresponding to the edge portions, can be based on that of FIG. 6A or 6B as a basis.

However, it is apparent that different forms of EBG structures other than those of FIGS. 6A and 6B can also be applied to the EMI noise reduction board of the present invention in accordance with the space allowance, the design freedom and the changes of the design limiting factors, as described above. Nevertheless, in the description of the EMI noise reduction board of the present invention, the case, in which the EBG structure of FIG. 6A or 6B is inserted into a portion of the board corresponding to the edge of the board, will be mainly described.

For the convenience of describing the present invention, an "inner portion, which corresponds to the edge of the EMI noise reduction board and into which an EBG structure is inserted, of the board" will hereinafter be cited within the description as an "edge portion." Although FIGS. 6A to 14D show only two EBG cells that are being inserted into the edge portion of the board, it shall be apparent that this is only for the convenience of illustration.

A first embodiment (hereinafter, collectively referred to as a "first type") of the EBG structure being inserted into the edge portion of the EMI noise reduction board of the present invention can be the same as that of FIG. 6A. Likewise, a second embodiment (hereinafter, collectively referred to as a "second type") can be the same as that of FIG. 6B.

As seen in the drawings, the first type EBG structure of FIG. 6A and the second type EBG structure of FIG. 6B all have 2-layered structure. The EBG structure being inserted into the edge portion of the EMI noise reduction board according to an embodiment of the present invention is based on the first type 2-layered EBG structure shown in FIG. 6A or the second type 2-layered EBG structure shown in FIG. 6B, and can have an expanding structure with a multiple of 2, for example, a 4-layered structure, a 6-layered structure and a 8-layered structure, by having the first type or the second type directly or partially modified or by having the first type or the second type repeatedly inserted into the EMI noise reduction board.

Figure 7:
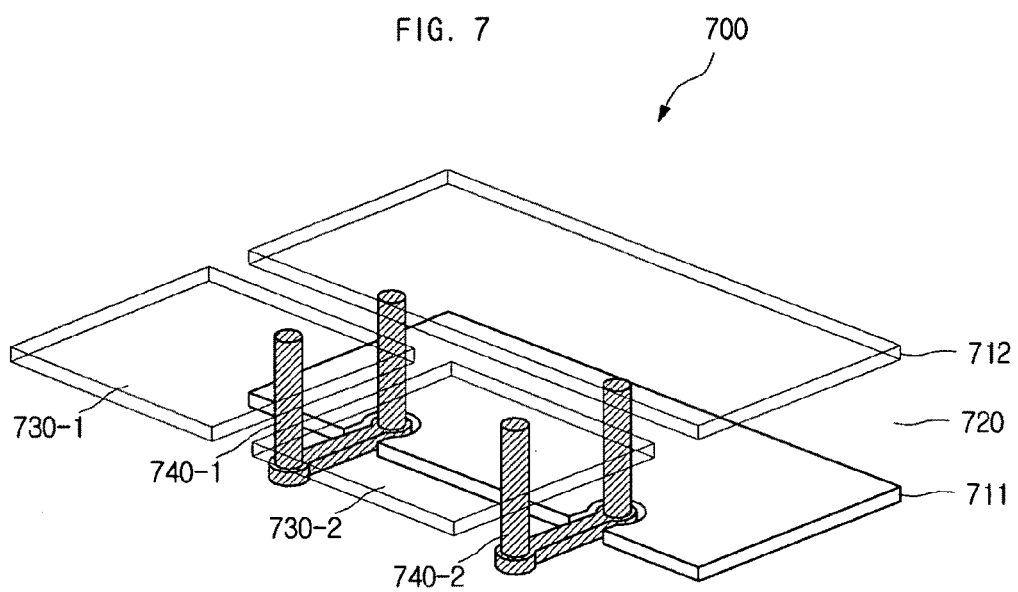
FIG. 7 is a perspective view of the 2-layered electromagnetic bandgap structure shown in FIG. 6A.
Figure 8A:
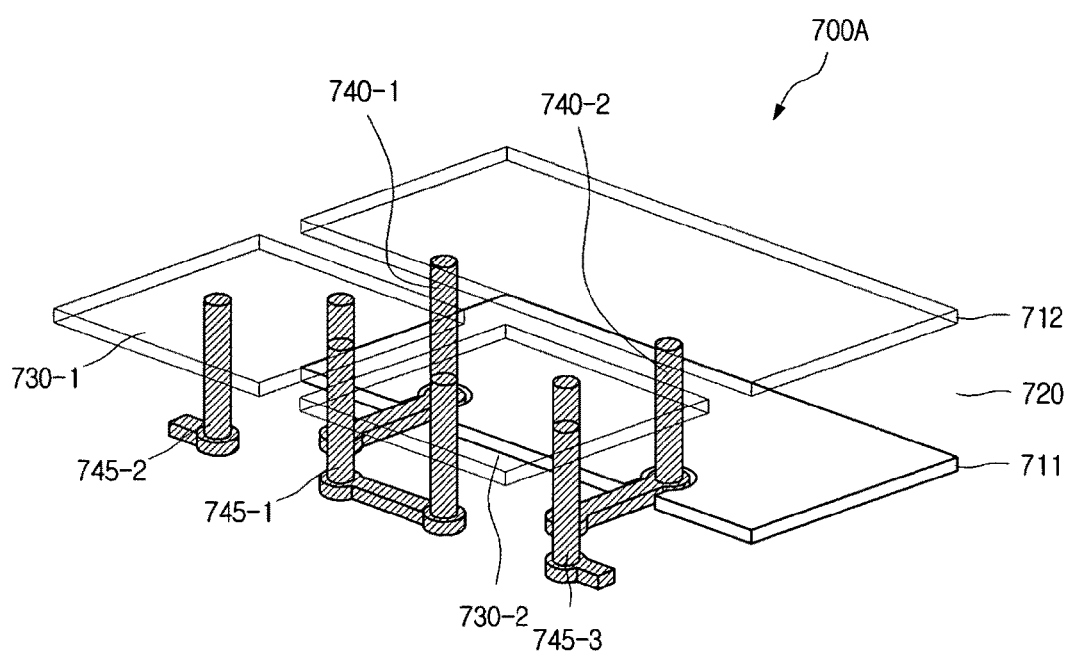
FIG. 8A shows an example of a modification of the 2-layered electromagnetic bandgap structure shown in FIG. 7.
Figure 8B:
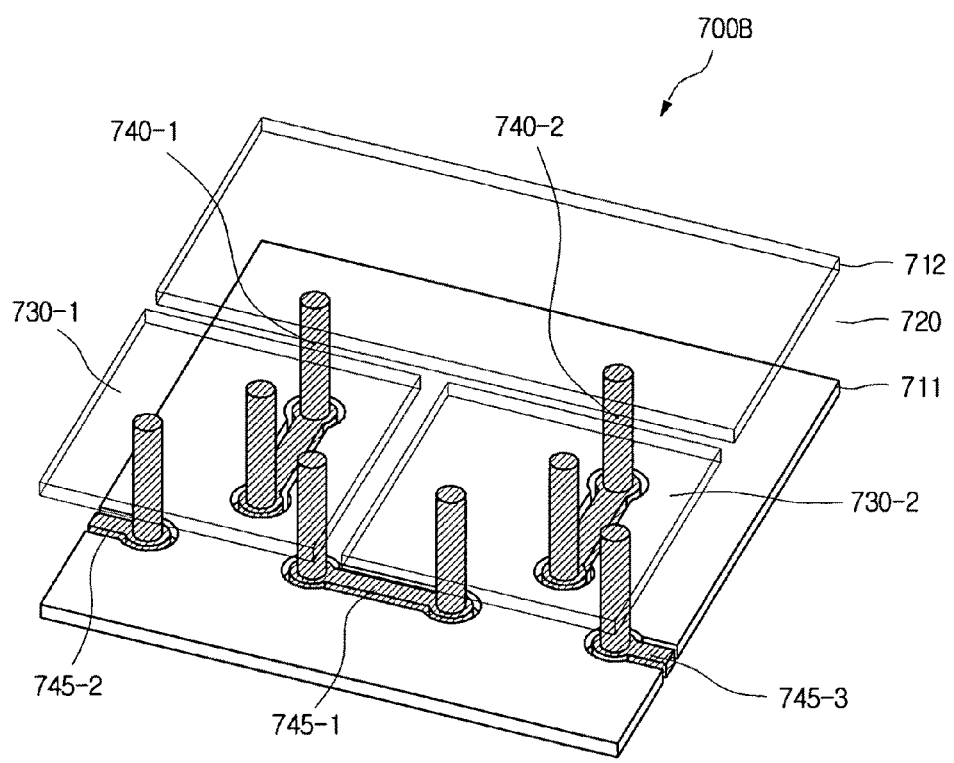
FIG. 8B shows another example of a modification of the 2-layered electromagnetic bandgap structure shown in FIG. 7.

For example, FIG. 7 shows a perspective view of the first type EBG structure of FIG. 6A when the first type EBG structure is applied directly to the EMI noise reduction board, while FIGS. 8A and 8B show some modifications of the first type EBG structure of FIG. 7. FIGS. 11A to 11D show some examples of a 4-layered EBG structure expanded from the 2-layered EBG structure shown in FIG. 8B, in which the 4-layered EBG structure is formed by repeatedly stacking the 2-layered EBG structure, and FIGS. 12A and 12B show some examples of the 4-layered EBG structure shown in FIGS. 11A to 11D, in which each via installed in the 4-layered EBG structure is substituted for a plated through hole (PTH).

Figure 9:
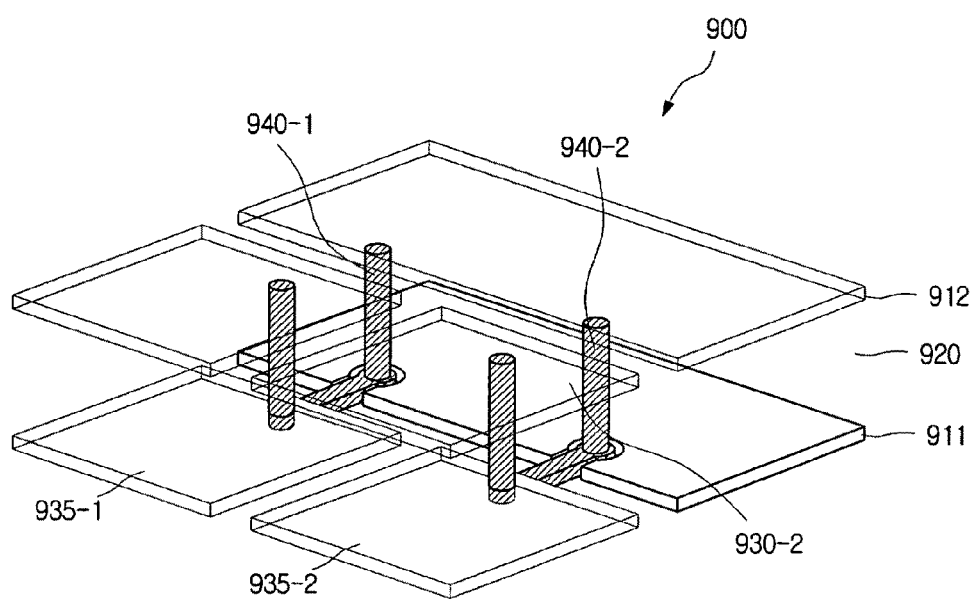
FIG. 9 is a perspective view of the 2-layered electromagnetic bandgap structure shown in FIG. 6B.
Figure 10A:
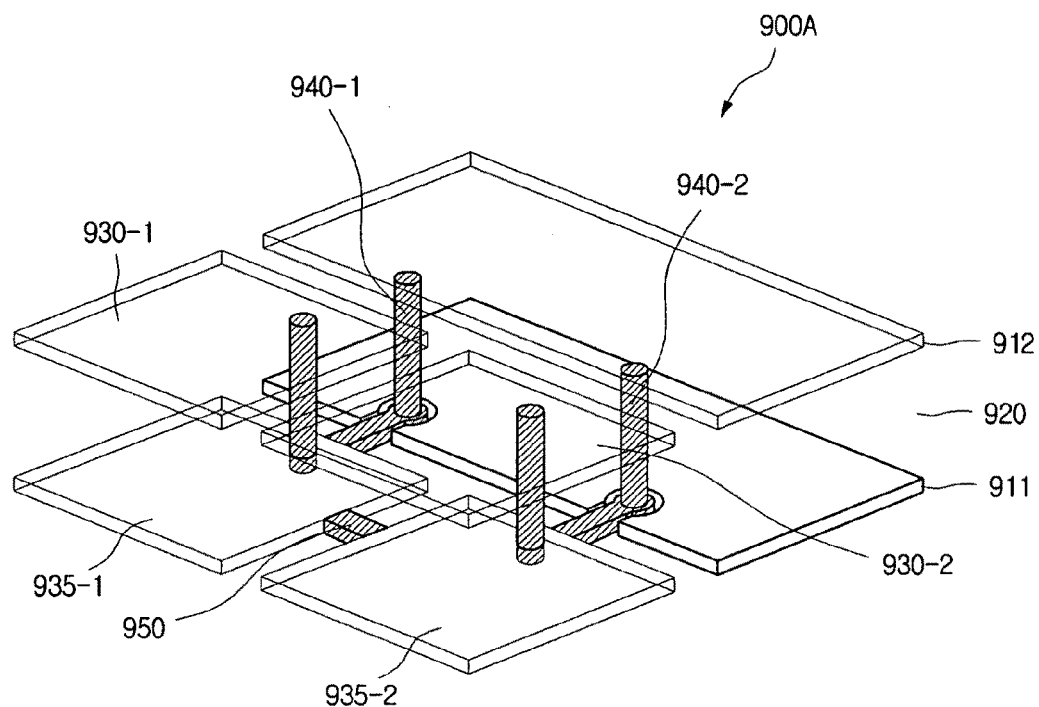
FIG. 10A is an example of a modification of the 2-layered electromagnetic bandgap structure shown in FIG. 9.
Figure 10B:
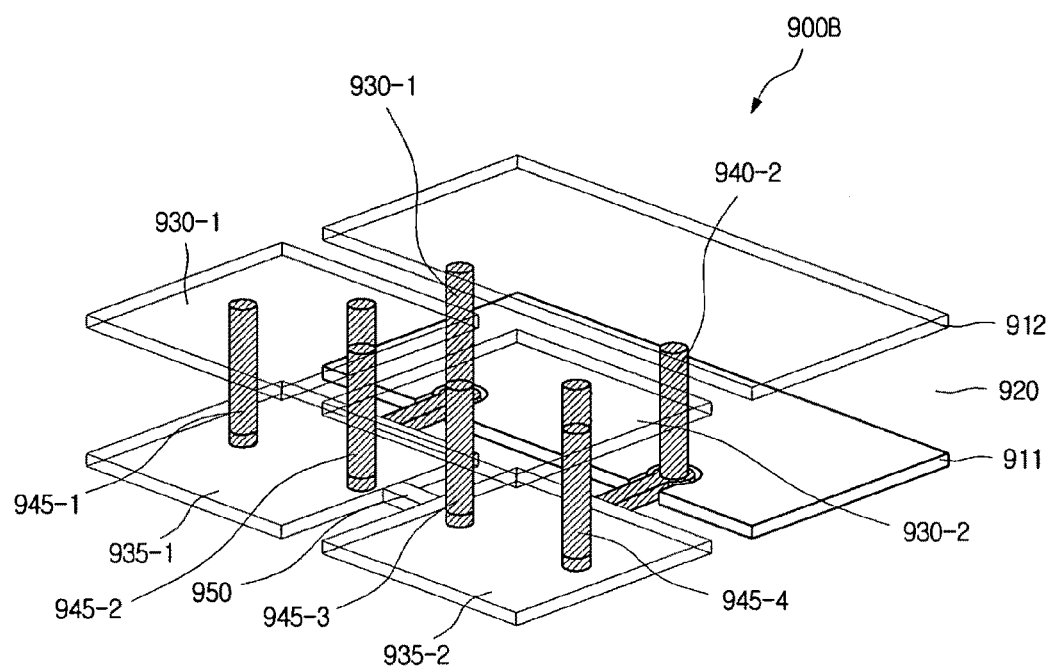
FIG. 10B is another example of a modification of the 2-layered electromagnetic bandgap structure shown in FIG. 9.
Figure 14B:
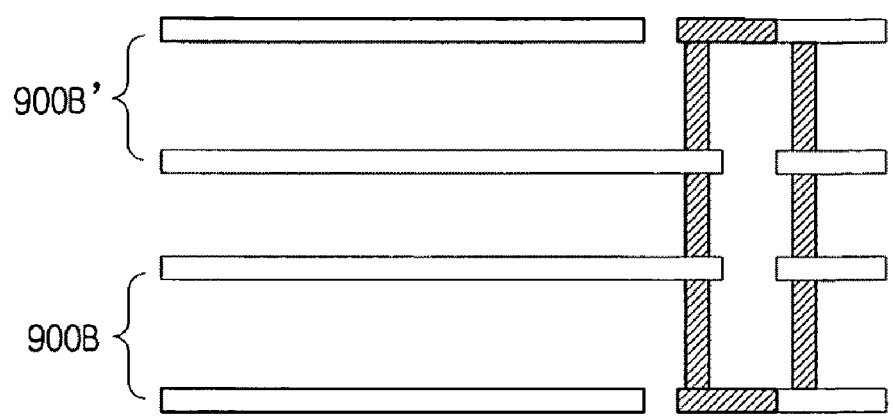
Figure 14C:
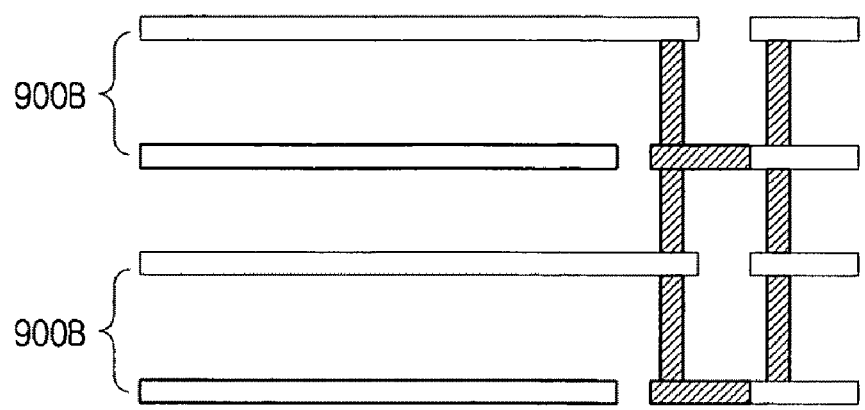
Figure 14D:
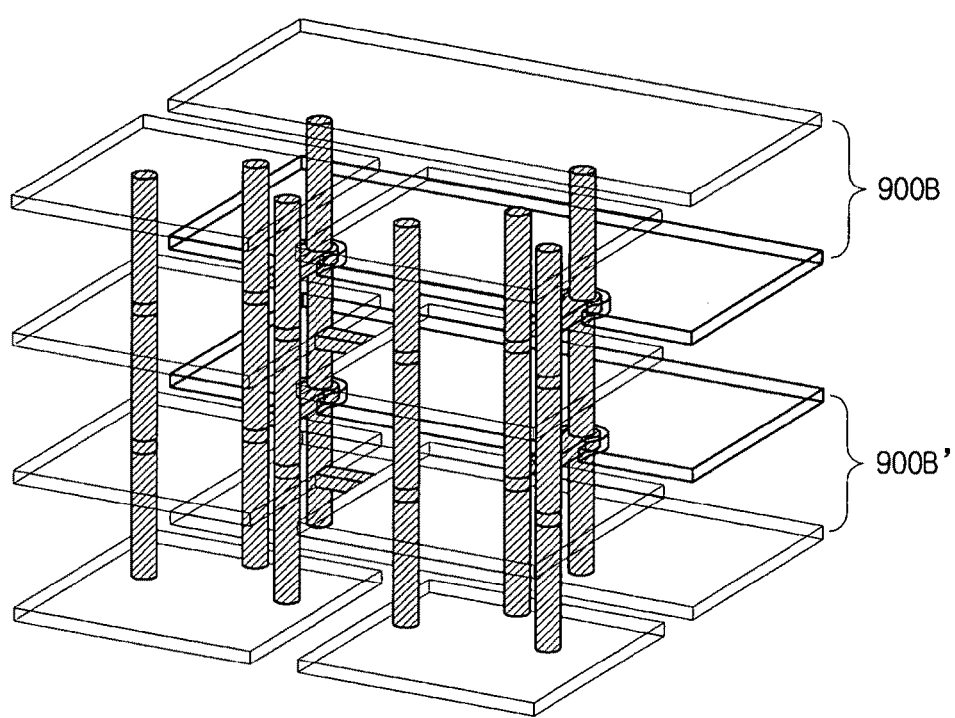
FIG. 14D is a perspective view of the 4-layered electromagnetic bandgap structure shown in FIG. 14A.

Likewise, FIG. 9 shows a perspective view of the second type EBG structure of FIG. 6B when the second type EBG structure is applied directly to the EMI noise reduction board, while FIGS. 10A and 10B show some modifications of the second type EBG structure of FIG. 9. FIGS. 13A to 13D show some examples of a 4-layered EBG structure expanded from the 2-layered EBG structure shown in FIG. 10B, in which the 4-layered EBG structure is formed by repeatedly stacking the 2-layered EBG structure, and FIGS. 14A and 14B show some examples of the 4-layered EBG structure shown in FIGS. 13A to 13D, in which each via installed in the 4-layered EBG structure is substituted for a plated through hole (PTH).

Hereinafter, the basic first type 2-layered EBG structure shown in FIGS. 6A and 7, some modifications of the basic first type 2-layered EBG structure (FIGS. 8A and 8B) and some expanded modifications of the basic first type 2-layered EBG structure (FIGS. 11A to 11D and 12A to 12D) will be described. Afterwards, the basic second type 2-layered EBG structure shown in FIGS. 6B and 9, some modifications of the basic second type 2-layered EBG structure (FIGS. 10A and 10B) and some expanded modifications of the basic second type 2-layered EBG structure (FIGS. 13A to 13D and 14A to 14D) will be described.

First of all, with reference to FIGS. 6A and 7, a basic first type 2-layered EBG structure 700, which is inserted into the edge portion of the board, has a structure in which metal plates 730-1 and 730-2 (hereinafter, collectively referred to as 730) separated physically from each other are placed in a line along the edge portion of the board and in which the metal plates 730 are electrically connected by each of stitching vias 740-1 and 740-2 (hereinafter, collectively referred to as 740) (i.e., a first via 741→a connection pattern 743→a second via 742) to another conductive portion (refer to the metal layer 712), which is placed adjacent to the metal plates 730 towards the direction of the EMI noise on the same planar surface.

Here, the stitching vias 740 penetrate a dielectric layer 720, and a portion (i.e., the connection pattern 743) of the stitching vias 740 is formed through a planar surface (i.e., the same planar surface as the metal layer 711) that is different from the metal plates 730.

As such, the basic first type EBG structure 700 shown in FIGS. 6A and 7 is not so different from the 2-layered VS-EBG structure, which has been previously described through FIG. 4A or 4C, in structure. However, the basic first type EBG structure 700 is different from the previously described VS-EBG structure that the metal plates forming each EBG cell are placed in a line along the edge portion of the board (i.e., the edge end, to which an EMI noise conducted, of the board) so as to shield the edge noise.

An EBG structure 700A of FIG. 8A is a partial modification of FIG. 7, and can have additional stitching vias 745-1, 745-2 and 745-3 that electrically connect any two adjacent metal plates among the metal plates 730 placed in a line along the edge portion of the board. In a noise transferable path of EMI noise, the metal plates 730 are positioned at the edge end of the noise transferable path, so that the EMI noise can be shielded only with the stitching vias 740, which are formed in the direction of the EMI noise. However, the shielding effect can be further increased with the additional stitching vias connecting any two adjacent metal plates, and the design freedom can be also increased through an additional adjustment of the inductance component.

An EBG structure 700B of FIG. 8B is another modification of FIG. 7, and can have a metal layer 711 formed in a certain part coinciding with the path through which each stitching via passes. In this case, a clearance hole can be formed in a certain part of the metal layer 711 corresponding to the path through which each stitching via passes because the metal plates 730 need to be electrically separated from the metal layer 711.

In accordance with the first type 2-layered EBG structure described above, an EMI noise conducted through the metal layer 712 can be prevented from being radiated to the outside of the board by way of the aforementioned first type EBG structure having band stop frequency properties that is inserted into the edge portion of the board.

However, it may be difficult to effectively shield the edge noise only with the EBG structures of FIGS. 7, 8A and 8B having 2-layered structure inserted between any two layers inside the board. Although it is possible to insert the EBG structure only between certain layers, in which the edge noise problem is particularly serious, of the layers inside the board, it is preferable that the EBG structure is formed throughout the whole layers inside the board corresponding to the edge portion so as to completely shield the edge noise because the EMI noise can be transferred to all the layers of the board.

As such, FIGS. 11A to 12D show some examples in which the first type 2-layered EBG structure is expanded to a 4-layered structure. Although FIGS. 11A to 12D show the case where the first type 2-layered EBG structure 700B shown in FIG. 8B is repeatedly stacked (or inserted) upwards to form a 4-layered structure, it shall be obvious that the EBG structure of FIG. 7 or 8A can be also expanded to a 4-layered structure through the same method. For the convenience of describing the present invention, FIGS. 11A to 12D use a different reference numeral 700B' for an EBG structure having an inverse order of layer arrangement that is opposite to the EBG structure 700B of FIG. 8B.

Figure 11A:
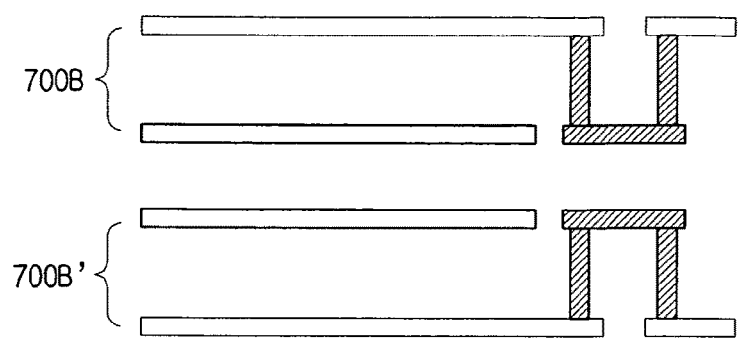
FIGS. 11A to 11C are vertical sectional views showing 4-layered electromagnetic bandgap structures expanded from the 2-layered electromagnetic bandgap structure shown in FIG. 8B.
Figure 11B:
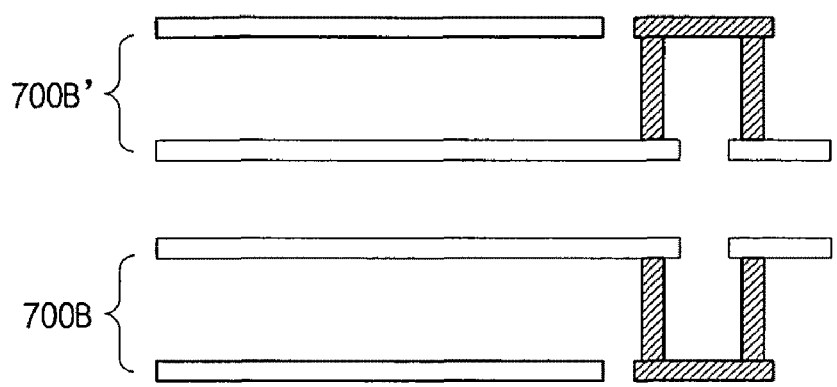
Figure 11C:
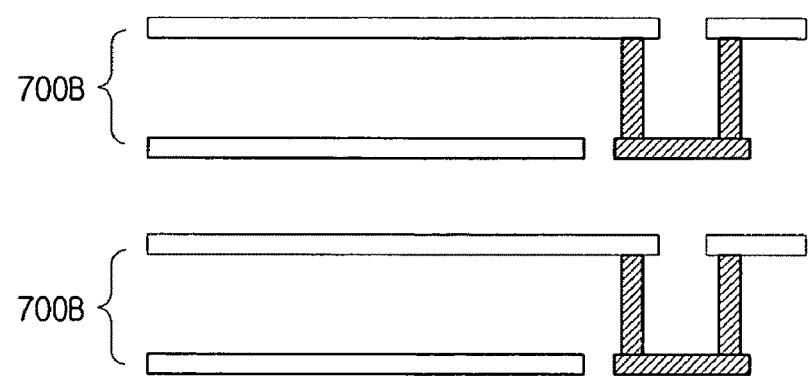
Figure 11D:
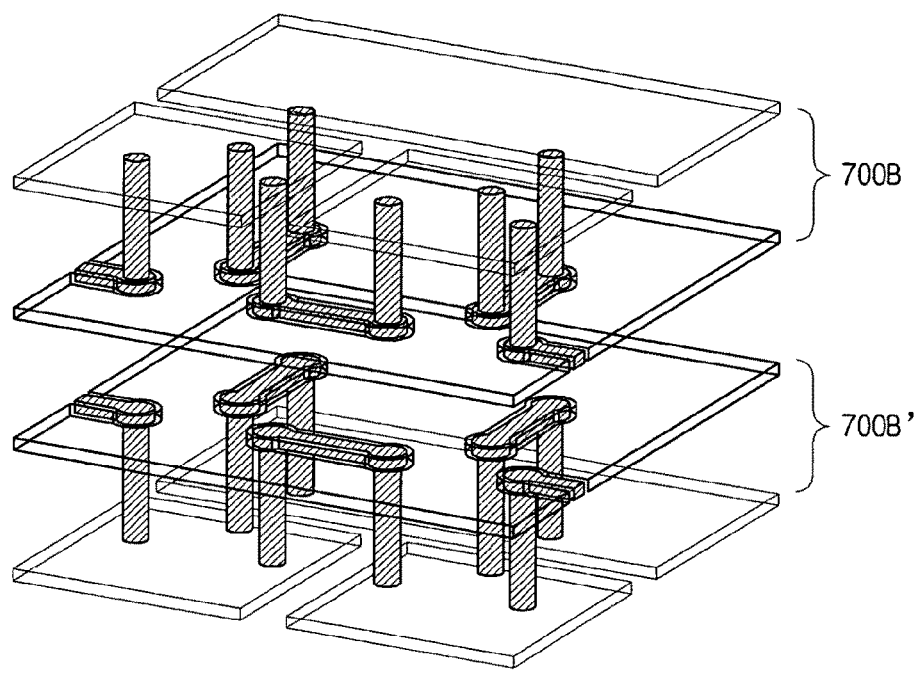
FIG. 11D is a perspective view of the 4-layered electromagnetic bandgap structure shown in FIG. 11A.
Figure 12B:
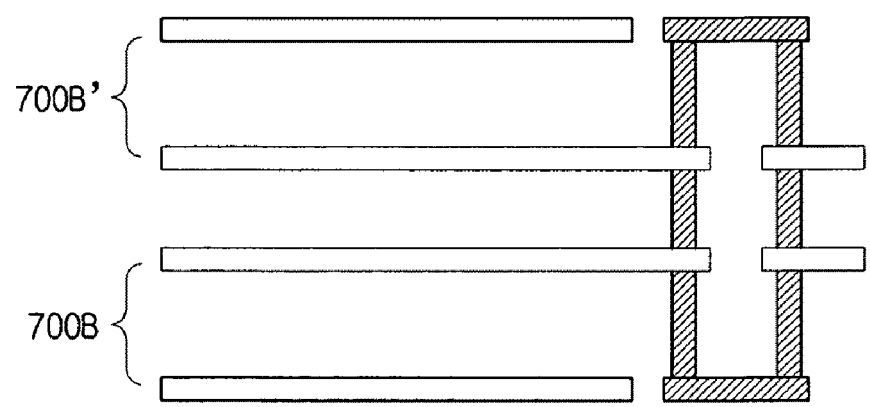
Figure 12C:
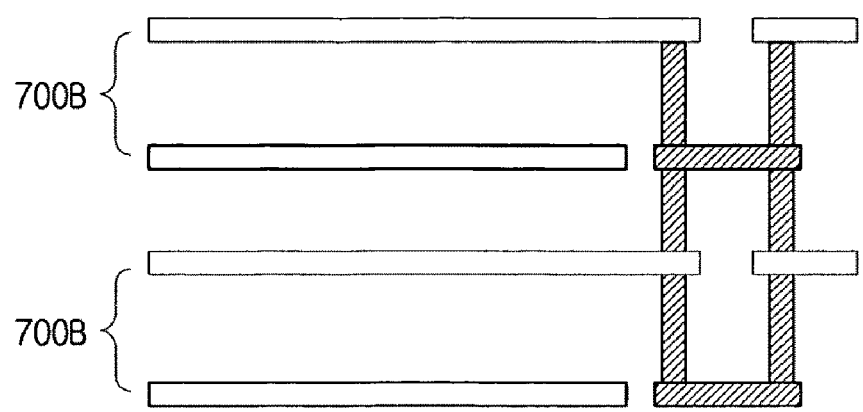
Figure 12D:
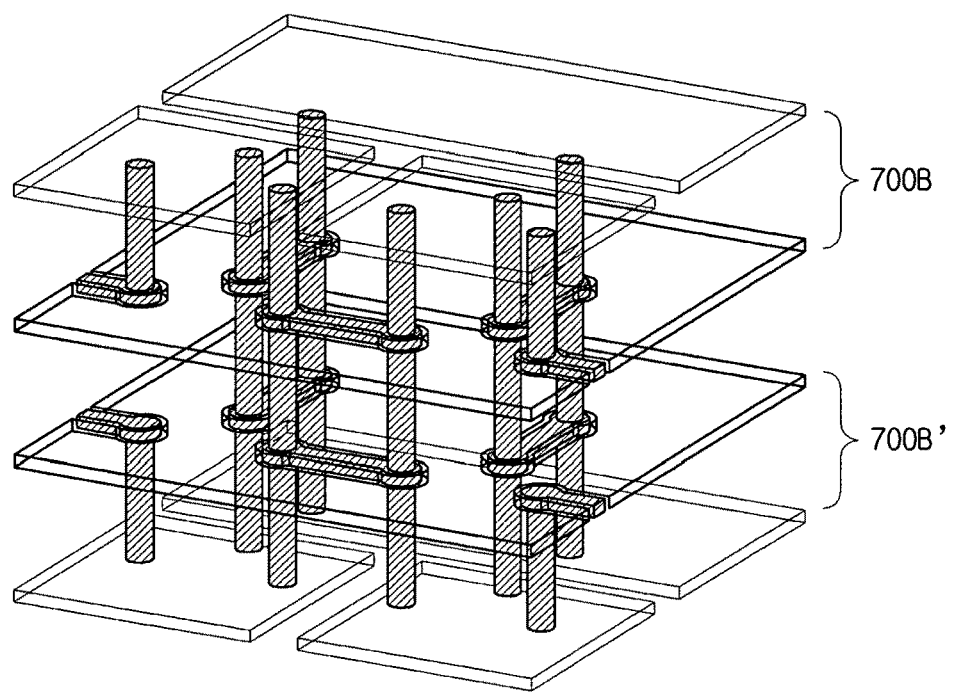
FIG. 12D is a perspective view of the 4-layered electromagnetic bandgap structure shown in FIG. 12A.
Figure 13A:
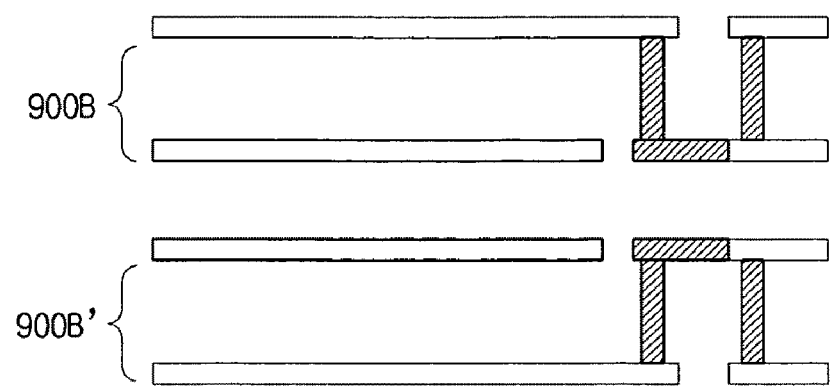
FIGS. 13A to 13C are vertical sectional views of 4-layered electromagnetic bandgap structures expanded from the 2-layered electromagnetic bandgap structure shown in FIG. 10B.
Figure 13B:
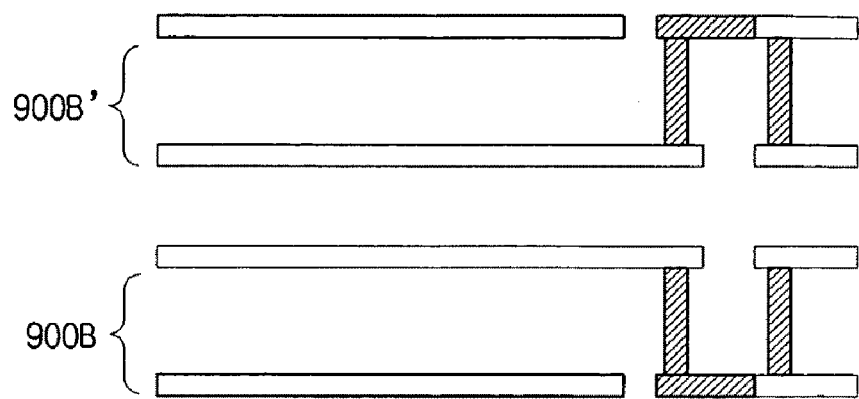
Figure 13C:
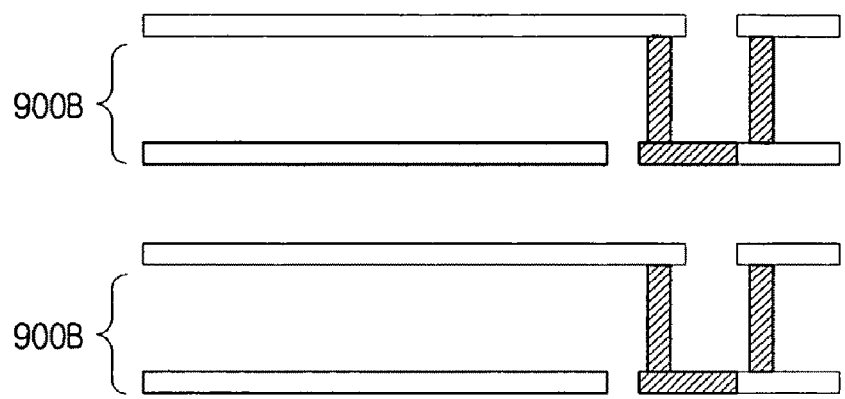
Figure 13D:
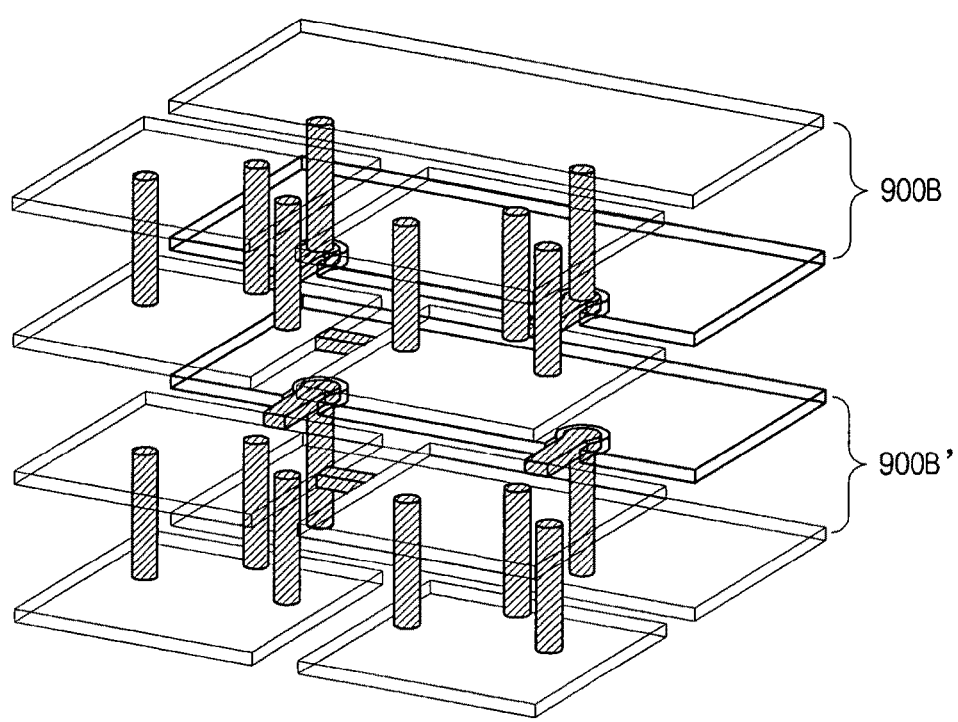
FIG. 13D is a perspective view of the 4-layered electromagnetic bandgap structure shown in FIG. 13A.

In FIG. 11A, an upside down EBG structure 700B' is inserted into the bottom two layers, and an original EBG structure 700B is inserted into the top two layers so as to form a 4-layered EBG structure. In FIG. 11B, an original EBG structure 700B is inserted into the bottom two layers, and an upside down EBG structure 700B' is inserted into the top two layers so as to form a 4-layered EBG structure. In FIG. 11C, two original 2-layered EBG structures 700B are inserted into the top and bottom layers so as to form a 4-layered EBG structure.

Although it is not illustrated in the drawings, it shall be obvious that two upside down 2-layered EBG structures 700B' can be inserted into the top and bottom layers so as to form a 4-layered EBG structure. Also, it shall be evident to any person of ordinary skills in the art that an EBG structure having a 6-layered structure, a 8-layered structure and so forth can be easily implemented by way of the repeatedly inserting method.

With reference to FIGS. 12A to 12D, it can be seen that a 4-layered EBG structure is also implemented through the same repeatedly inserting method of the 4-layered structures of FIGS. 11A to 11D. However, FIGS. 12A to 12D are different from FIGS. 11A to 11D that each via placed in the 4-layered EBG structure is substituted for a plated through hole (PTH). Through the use of PTH, the visas required for implementing the EBG structure can be formed at one time, making the production process simpler and efficient, compared to the case where vias have to be formed for each layer when using a blind via hole (BVH).

Hitherto, various forms of EBG structure based on the first type EBG structure of FIGS. 6A and 7 have been described. Hereinafter, various forms of EBG structure based on the second type EBG structure of FIGS. 6B and 9 will be described, and the description of the content that can be duplicated will be briefly described only.

With reference to FIGS. 6B and 9, a basic second type 2-layered EBG structure 900 being inserted into the edge portion has almost the same structure of the first type EBG structure shown in FIGS. 6A and 7. However, FIGS. 6B and 9 are slightly different from FIGS. 6A and 7 that the method of electrically connecting a plurality of metal plates 930-1 and 930-2 (hereinafter, collectively referred to as "first metal plates 930"), which are placed in a line on a planar surface corresponding to the edge portion of the board, with another conductive portion (refer to the metal layer 912), which is placed adjacent to the first metal plates 930 towards the direction of the EMI noise, is different.

In case of FIGS. 6B and 9, the first metal plates 930 can be connected by a first via 941 penetrating a dielectric layer 920→another metal plate (hereinafter, referred to as a "second metal plate 935") placed on a planar surface (i.e., the same planar surface as the metal layer 911) that is different from the first metal plates 930→a connection pattern 943→a second via 942 penetrating again the dielectric layer 920 to the metal layer 912. In other words, the electrical connection between the first metal plates 930 and the adjacent metal layer 912 placed on the same planar surface shown in FIGS. 6B and 9 can further include the second metal plate 935 besides a connection unit (the reference numeral 940 of FIG. 6B or the reference numerals 940-1 and 940-2 of FIG. 9) corresponding to the stitching vias 740 of FIGS. 6A and 7.

When the second metal plates (the reference numeral 935 of FIG. 6B or the reference numerals 935-1 and 935-2 of FIG. 9) (hereinafter, collectively referred to as the reference numeral 935) are viewed from the top, they are overlapped with the first metal plates 930. As such, when the second metal plates 935 are additionally formed so as to overlap the first metal plates 930, the capacitance component can be further increased due to the additional metal plates, thereby improving the design freedom when implementing the EBG structure.

In addition to the above, in case of the EBG structure 900A of FIG. 10A, any two adjacent second metal plates (for example, the reference numerals 935-1 and 935-2) of the second metal plates 935 can be electrically connected by a metal line 950 to each other. Furthermore, the EBG structure 900B of FIG. 10B further includes vias 945-1, 945-2, 945-3 and 945-4 (hereinafter, collectively referred to as a 'third via") that are placed adjacent to the area where the metal line 950 is formed. This arrangement can allow the capacitance component to be increased because of the additional forming of the metal line 950 and the third vias 945, thereby improving the design freedom when implementing the EBG structure.

Furthermore, the second type 2-layered EBG structure described above can also be expanded to a 4- or more-layered structure. Some examples are shown through FIGS. 13A to 14D. First of all, FIGS. 13A to 13D show 4-layered structures expanded by using an EBG structure 900B of FIG. 10B and an upside down EBG structure 900B'. Likewise, FIGS. 14A to 14D show the same 4-layered structures of FIGS. 13A to 13D except that each via placed in the above 4-layered structures is substituted for a plated through hole (PTH). The present embodiment is similar to the previously described embodiment of FIGS. 11A to 12D, and thus detailed descriptions will be omitted.

While the spirit of the present invention has been described in detail with reference to particular embodiments, the embodiments are for illustrative purposes only and shall not limit the present invention. It is to be appreciated that those skilled in the art can change or modify the embodiments without departing from the scope and spirit of the present invention.

What is claimed is:

1. An EMI noise reduction board, having an electromagnetic bandgap structure with band stop frequency properties inserted into an inner portion of the board so as to shield an EMI noise, the inner portion corresponding to an edge of the board, the EMI noise being conducted from the inside to the edge of the board and radiating to the outside of the board.

2. The EMI noise reduction board of claim 1, wherein the electromagnetic bandgap structure comprises:
   a plurality of conductive plates, placed in a line along the edge of the board; and
   a first stitching via, configured to electrically connect each of the plurality of conductive plates and another conductive portion by having a part of the first stitching via pass through a planar surface that is different from the conductive plates, said another conductive portion being placed adjacent to the conductive plates towards a direction of the EMI noise.

3. The EMI noise reduction board of claim 2, wherein the first stitching via comprises:
   a first via, having one end part connected to the another conductive portion;
   a second via, having one end part connected to one of the plurality of conductive plates; and
   a connection pattern, having one end part connected to the other end part of the first via and having the other end part connected to the other end part of the second via, the connection pattern being placed on a planar surface that is different from the conductive plates.

4. The EMI noise reduction board of claim 2, wherein the electromagnetic bandgap structure further comprises a second stitching via electrically connecting any two of the plurality of conductive plates, placed in a line, with each other by having a part of the second stitching via pass through a planar surface that is different from the conductive plates.

5. The EMI noise reduction board of claim 4, wherein the second stitching via comprises:
   a third via, having one end part connected to one of the any two conductive plates;
   a fourth via, having one end part connected to the other one of the any two conductive plates; and
   a connection pattern, having one end part connected to the other end part of the third via and having the other end part connected to the other end part of the fourth via, the connection pattern being placed on a planar surface that is different from the conductive plates.

6. The EMI noise reduction board of claim 2, wherein the electromagnetic bandgap structure has a 2-layered structure in which a planar surface where the plurality of conductive plates are located is a first layer and a planar surface where the part of the first stitching via is located is a second layer,
   whereas the 2-layered electromagnetic bandgap structure has an expanding structure with a multiple of 2 by having the 2-layered electromagnetic bandgap structure repeatedly stacked and inserted into an inner portion of the board corresponding to the edge of the board.

7. The EMI noise reduction board of claim 6, wherein a 4-layered electromagnetic bandgap structure is formed by having a 2-layered electromagnetic bandgap structure and another 2-layered electromagnetic bandgap structure repeatedly stacked on top of each other so as to have a same order of layer arrangement.

8. The EMI noise reduction board of claim 6, wherein a 4-layered electromagnetic bandgap structure is formed by having a 2-layered electromagnetic bandgap structure and another 2-layered electromagnetic bandgap structure repeatedly stacked on top of each other so as to have an inverse order of layer arrangement.

9. The EMI noise reduction board of claim 6, wherein, if the 2-layered electromagnetic bandgap structure is expanded to a 4- or more-layered structure by having two or more 2-layered electromagnetic bandgap structures repeatedly stacked on top of each other, a plated through hole (PTH) is formed where each of the vias constituting the first stitching via is placed in the 2-layered electromagnetic bandgap structure, the PTH collectively penetrating through the 4- or more-layered structure.

10. The EMI noise reduction board of claim 2, wherein the electromagnetic bandgap structure is inserted into all inner layers of the board corresponding to the location of the edge of the board.

11. The EMI noise reduction board of claim 2, wherein the electromagnetic bandgap structure is inserted into the board in the shape of a closed loop such that the electromagnetic bandgap structure completely surrounds the edge of the board.

12. The EMI noise reduction board of claim 1, wherein the electromagnetic bandgap structure comprises:
   a plurality of first conductive plates, placed in a line along the edge of the board;
   a plurality of second conductive plates, each of the second conductive plates being overlapped with each of the plurality of first conductive plates on a planar surface that is different from the first conductive plates;
   a first via, configured to electrically connect each of the plurality of first conductive plates and each of the plurality of second conductive plates with each other;
   a second via, configured to electrically connect one end part thereof to another conductive portion that is placed adjacent to the plurality of first conductive plates towards a direction of the EMI noise; and
   a connection pattern, configured to connect one end part thereof to the other end part of the second via and connect the other end part thereof connected to each of the plurality of second conductive plates so as to electrically connect said another conductive portion and each of the plurality of second conductive plates with each other.

13. The EMI noise reduction board of claim 12, wherein the electromagnetic bandgap structure further comprises a conductive line electrically connecting any two adjacent second conductive plates with each other.

14. The EMI noise reduction board of claim 13, wherein the electromagnetic bandgap structure electrically connects each of the plurality of first conductive plates and each of the plurality of second conductive plates, and further comprises a third via formed adjacent to the conductive line, the plurality of first conductive plates and the plurality of second conductive plates overlapping each other.

15. The EMI noise reduction board of claim 12, wherein a dielectric layer is interposed between the plurality of first conductive plates and the plurality of second conductive plates.

16. The EMI noise reduction board of claim 12, wherein the electromagnetic bandgap structure has a 2-layered structure in which a planar surface where the plurality of first conductive plates are located is a first layer and a planar surface where the plurality of second conductive plates and the connection pattern are located is a second layer,
   whereas the 2-layered electromagnetic bandgap structure has an expanding structure with a multiple of 2 by having the 2-layered electromagnetic bandgap structure repeatedly stacked and inserted into an inner portion of the board corresponding to the edge of the board.

17. The EMI noise reduction board of claim 16, wherein a 4-layered electromagnetic bandgap structure is formed by having a 2-layered electromagnetic bandgap structure and another 2-layered electromagnetic bandgap structure repeatedly stacked on top of each other so as to have a same order of layer arrangement.

18. The EMI noise reduction board of claim 16, wherein a 4-layered electromagnetic bandgap structure is formed by having a 2-layered electromagnetic bandgap structure and another 2-layered electromagnetic bandgap structure repeatedly stacked on top of each other so as to have an inverse order of layer arrangement.

19. The EMI noise reduction board of claim 16, wherein, if the 2-layered electromagnetic bandgap structure is expanded to a 4- or more-layered structure by having two or more 2-layered electromagnetic bandgap structures repeatedly stacked on top of each other, a plated through hole (PTH) is formed where each of the vias constituting the first stitching via is placed in the 2-layered electromagnetic bandgap structure, the PTH collectively penetrating through the 4- or more-layered structure.

20. The EMI noise reduction board of claim 12, wherein the electromagnetic bandgap structure is inserted into all inner layers of the board corresponding to the location of the edge of the board.

21. The EMI noise reduction board of claim 12, wherein the electromagnetic bandgap structure is inserted into the board in the shape of a closed loop such that the electromagnetic bandgap structure completely surrounds the edge of the board.

* * * * *